(12) United States Patent
Jee et al.

(10) Patent No.: US 8,481,387 B2
(45) Date of Patent: Jul. 9, 2013

(54) METHOD OF FORMING AN INSULATION STRUCTURE AND METHOD OF MANUFACTURING A SEMICONDUCTOR DEVICE USING THE SAME

(75) Inventors: Jung-Geun Jee, Seoul (KR); Young-Jin Noh, Suwon-si (KR); Bon-Young Koo, Suwon-si (KR); Chul-Sung Kim, Seongnam-si (KR); Hun-Hyeoung Leam, Yongin-si (KR); Woong Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/188,587

(22) Filed: Jul. 22, 2011

(65) Prior Publication Data

US 2011/0275190 A1 Nov. 10, 2011

Related U.S. Application Data

(62) Division of application No. 11/639,164, filed on Dec. 15, 2006, now Pat. No. 8,008,214.

(30) Foreign Application Priority Data

Dec. 16, 2005 (KR) .................. 10-2005-0124349
Dec. 13, 2006 (KR) .................. 10-2006-0127089

(51) Int. Cl.
*H01L 21/336* (2006.01)

(52) U.S. Cl.
USPC ........... 438/257; 438/264; 438/769; 257/315; 257/E21.422; 257/E21.267

(58) Field of Classification Search
USPC ................................. 438/263, 264
See application file for complete search history.

(56) References Cited

U.S. PATENT DOCUMENTS 6,372,578 B1 * 4/2002 Muramatsu ............ 438/264
6,541,395 B1 4/2003 Trivedi et al.
(Continued)

FOREIGN PATENT DOCUMENTS

JP 09-148543 6/1997
KR 10-2000-0001261 1/2000
(Continued)

OTHER PUBLICATIONS

Office Action dated Oct. 31, 2007 for corresponding Korean Application No. 2006-127089.

(Continued)

*Primary Examiner* — Michelle Mandala
*Assistant Examiner* — Shaka White
(74) *Attorney, Agent, or Firm* — Harness, Dickey & Pierce, P.L.C.

(57) ABSTRACT

In a method of forming an insulation structure, at least one oxide layer is formed on an object by at least one oxidation process, and then at least one nitride layer is formed from the oxide layer by at least one nitration process. An edge portion of the insulation structure may have a thickness substantially the same as that of a central portion of the insulation structure so that the insulation structure may have a uniform thickness and improved insulation characteristics. When the insulation structure is employed as a tunnel insulation layer of a semiconductor device, the semiconductor device may have enhanced endurance and improved electrical characteristics because a threshold voltage distribution of cells in the semiconductor device may become uniform.

4 Claims, 35 Drawing Sheets

U.S. PATENT DOCUMENTS

| | | |
|---|---|---|
| 6,624,090 B1 | 9/2003 | Yu et al. |
| 7,326,655 B2 | 2/2008 | Joe |
| 2004/0082198 A1 | 4/2004 | Nakamura et al. |
| 2004/0241991 A1 | 12/2004 | Aoyama et al. |
| 2005/0266637 A1 | 12/2005 | Wang |
| 2006/0043493 A1 | 3/2006 | Uchiyama |
| 2006/0166440 A1* | 7/2006 | Kaneoka et al. .............. 438/257 |

FOREIGN PATENT DOCUMENTS

| | | |
|---|---|---|
| KR | 10-2000-0007412 | 2/2000 |
| KR | 10-2002-0002750 | 1/2002 |
| KR | 10-2005-0053247 | 6/2005 |
| KR | 10-2005-0086296 | 8/2005 |
| KR | 10-2005-106161 | 11/2005 |
| KR | 10-2006-0058813 | 6/2006 |

OTHER PUBLICATIONS

Hattori, "HCl oxidation conditions for stacking-fault nuclei gettering and for silicon etching", J. Appl. Phys. 49 (5), May 1978.

Lucovsky, "Ultrathin nitrided gate dielectrics: Plasma processing, chemical characterization, performance, and reliability", IBM J. Res. Develop., vol. 43, No. 3, May 1999.

* cited by examiner

METHOD OF FORMING AN INSULATION STRUCTURE AND METHOD OF MANUFACTURING A SEMICONDUCTOR DEVICE USING THE SAME

CROSS-REFERENCE TO RELATED APPLICATIONS

This application is a divisional application of U.S. application Ser. No. 11/639,164, filed on Dec. 15, 2006, now U.S. Pat. No. 8,008,214, which claims priority under 35 USC §119 to Korean Patent Application No. 2005-124349 filed on Dec. 16, 2005 and Korean Patent Application No. 2006-127089 filed on Dec. 13, 2006, the entire contents of each of which are incorporated herein by reference.

BACKGROUND OF THE INVENTION

1. Field of the Invention

Example embodiments of the present invention relate to a method of forming an insulation structure and a method of manufacturing a semiconductor device using the method of forming the insulation structure. More particularly, example embodiments of the present invention relate to a method of forming an insulation structure having a uniform thickness and improved electrical characteristics, and a method of manufacturing a semiconductor device using the method of forming the insulation structure.

2. Description of the Related Art

Semiconductor memory devices are usually divided into volatile semiconductor memory devices such as dynamic random access memory (DRAM) devices or static random access memory (SRAM) devices and non-volatile semiconductor memory devices such as flash memory devices or electrically erasable and programmable read only memory (EEPROM) devices. The volatile semiconductor memory devices may lose stored data when power is off, whereas the non-volatile semiconductor memory devices may maintain stored data even when power is off. Since the stored data may be maintain in the non-volatile semiconductor memory devices for a relatively long time, the non-volatile semiconductor memory devices have been widely used in various electronic apparatuses such as digital cameras, cellular phones, MP3 players, etc.

Recently, an insulation layer having a multi-layered structure has been employed in a semiconductor memory device so as to improve electrical characteristics of the semiconductor memory device. For example, Korean Laid-Open Patent Publication No. 2002-2750 discloses a method of manufacturing a semiconductor device having an insulation layer having a multi-layered structure by an oxidation process and a nitration process.

FIGS. 1 to 5 are cross-sectional views illustrating the method of manufacturing the semiconductor device having the insulation layer according to the above Korean Laid-Open Patent Publication.

Referring to FIG. 1, an isolation layer 10 is formed on a semiconductor substrate 5 to divide the semiconductor substrate 5 into an active region and a field region.

A thermal oxidation layer 15 is formed on the semiconductor substrate 5 having the isolation layer 10. The thermal oxide layer 15 is formed by a dry thermal oxidation process or a wet thermal oxidation process. The thermal oxide layer 15 has a thickness of about 20 Å to about 50 Å based on an upper face of the semiconductor substrate 5. The thickness of the thermal oxide layer 15 is adjusted in accordance with desired electrical characteristics of the semiconductor device.

Referring to FIG. 2, a first nitrogen-containing layer 20 is formed between the semiconductor substrate 5 and the thermal oxide layer 15 and between the isolation layer 10 and the thermal oxide layer 15. The first nitrogen-containing layer 20 is formed by thermally treating the thermal oxide layer 15 under a nitrogen monoxide (NO) atmosphere or a nitrous oxide ($N_2O$) atmosphere.

In a thermal treatment process for forming the first nitrogen-containing layer 20, nitrogen atoms are accumulated at an interface between the semiconductor substrate 5 and the thermal oxide layer 15 and at an interface between the isolation layer 10 and the thermal oxide layer 15 as arrows shown in FIG. 2. Hence, the first nitrogen-containing layer 20 is formed between the semiconductor substrate 5 and the thermal oxide layer 15 and between the isolation layer 10 and the thermal oxide layer 15. The first nitrogen-containing layer 20 may reduce a roughness of the interface between the semiconductor substrate 5 and the thermal oxide layer 15 and a roughness of the interface between the isolation layer 10 and the thermal oxide layer 15.

Referring to FIG. 3, a second nitrogen-containing layer 25 is formed on the thermal oxide layer 15 by nitrifying a surface of the thermal oxide layer 15, thereby forming an insulation layer 30 on the semiconductor substrate 5. The insulation layer 30 includes the thermal oxide layer 15, the first nitrogen-containing layer 20 and the second nitrogen-containing layer 25.

The second nitrogen-containing layer 25 is formed by performing a remote plasma process on the surface of the thermal oxide layer 15. In the remote plasma process, nitrogen atoms are accumulated at the surface of the thermal oxide layer 15 as arrows shown in FIG. 3, thereby forming the second nitrogen-containing layer 25 on the thermal oxide layer 15. The second nitrogen-containing layer 25 may prevent impurities from permeating into the insulation layer 30 in successive processes.

Referring to FIG. 4, a gate electrode layer 35 is formed on the insulation layer 30. The gate electrode layer 35 is formed using metal silicide or polysilicon doped with impurities.

Referring to FIG. 5, a gate mask (not shown) is formed on the gate electrode layer 35, and then the gate electrode layer 35 and the insulation layer 30 are successively etched using the gate mask as an etching mask. Thus, a gate structure 65 having an insulation layer pattern 55 and a gate electrode 60 is formed on the semiconductor substrate 5. The insulation layer pattern 55 includes a first nitrogen-containing layer pattern 40, a thermal oxide layer pattern 45 and a second nitrogen-containing layer pattern 50 sequentially formed on the semiconductor substrate 5.

Impurities are implanted into portions of the semiconductor substrate 5 adjacent to the gate structure 65 to form source/drain regions (not shown) at the portions of the semiconductor substrate 5. Therefore, the semiconductor device having the insulation layer 30 is formed on the semiconductor substrate 5.

As for a current non-volatile semiconductor device such as a flash memory device, an active region of a semiconductor substrate is defined by an isolation layer filling a relatively deep trench formed by partially etching the semiconductor substrate, and then a tunnel insulation layer is formed on the active region of the semiconductor substrate. Thus, the above-mentioned processes for forming the insulation layer may not be easily employed in forming the tunnel insulation layer of the current non-volatile semiconductor device. Particularly, in a flash memory device including isolation layer patterns having relatively high heights and a floating gate formed between the isolation layer patterns by a self-aligned ploy (SAP) process, tunnel insulation layers may not be uniformly formed between the isolation layer patterns on a semiconductor substrate because the semiconductor substrate may be damaged in an etching process for forming the trenches.

A current flash memory device generally includes a silicon substrate having an active region defined by isolation layer patterns, a tunnel insulation layer formed on the active region, a floating gate provided on the tunnel insulation layer, a dielectric layer formed on the floating gate and a control gate disposed on the dielectric layer. In the current flash memory device, a programming operation or an erasing operation may be accomplished by a tunneling phenomenon. That is, the programming operation may be performed by accumulating charges into the floating gate through the tunnel insulation layer, whereas the erasing operation may be carried out by removing the floating gate through the tunnel insulation layer. To properly store or erase data into or from the flash memory device, threshold voltage (Vth) distribution of memory cells in the flash memory device may be reduced as small as possible. Hence, the tunnel insulation layer may have a uniform thickness so as to desirably reduce the threshold voltage distribution of the memory cells in the flash memory device. In other words, a central portion of the tunnel insulation layer may have a thickness substantially the same as that of a peripheral portion including an edge of the tunnel insulation layer. That is, a thickness difference between the central portion and the peripheral portion may be reduced. However, the tunnel insulation layer may not be uniformly formed on the silicon substrate because of the damage to the silicon substrate generated in an etching process for forming trenches. Particularly, the thickness of the edge of the tunnel insulation layer may become unfortunately thin so that the threshold voltage distribution of the memory cells may be considerably increased.

Meanwhile, the charges may not be trapped in the tunnel insulation layer during the programming operation and the erasing operation in order to improve endurance of the flash memory device and to enhance reliability of the flash memory device. Namely, charge trapping sites may not be undesirably generated in the tunnel insulation layer, to thereby increase the endurance and the reliability of the flash memory device. In the above-mentioned flash memory device, however, the charge trapping sites may be considerably generated in the tunnel insulation layer during the programming and erasing operations of the flash memory device even though the tunnel insulation layer may be formed using a dielectric material having a high dielectric constant such as metal oxide.

SUMMARY OF THE INVENTION

Example embodiments of the present invention provide a method of forming an insulation structure having a uniform thickness and enhanced electrical characteristics.

Example embodiments of the present invention provide a method of manufacturing a semiconductor device including an isolation structure having a uniform thickness and enhanced electrical characteristics.

According to one aspect of the present invention, there is provided a method of forming an insulation structure. In the method of forming the insulation structure, at least one oxide layers are formed on an object by at least one oxidation process. Additionally, at least one nitride layer is formed from portions of the at least one oxide layer by at least one nitration process.

In formations of the oxide layer and the nitride layer according to some example embodiments of the present invention, a first oxidation process may be carried out to form a first preliminary oxide layer on the object by partially oxidizing the object. The nitration process may be performed to simultaneously form a preliminary nitride layer from a lower portion of the oxide layer on the object and a second preliminary oxide layer from the first preliminary oxide layer on the preliminary nitride layer. A second oxidation process may be executed to simultaneously form the nitride layer from the preliminary nitride layer on the object, a lower oxide layer from the second preliminary oxide layer on the nitride layer, and an upper oxide layer from the second preliminary oxide layer on the lower oxide layer.

In an example embodiment of the present invention, the first oxidation process may include a first radical oxidation process. The first preliminary oxide layer may be formed in accordance with a reaction between a first oxygen radical and silicon included in the object. The first oxygen radical may be generated by thermally treating a first reaction gas including an oxygen gas and a hydrogen gas at a temperature of about 800° C. to about 1,000° C. and a pressure of about 0.1 Torr to about 0.5 Torr.

In an example embodiment of the present invention, the first oxygen radical may be generated by a direct plasma process or a remote plasma process.

In an example embodiment of the present invention, the nitration process may include a thermal nitration process. The preliminary nitride layer may be formed in accordance with an accumulation of nitrogen atoms generated from a second reaction gas including nitrogen at the lower portion of the first preliminary oxide layer. The second reaction gas may include a nitrogen monoxide (NO) gas, a nitrous oxide ($N_2O$) gas, an ammonia ($NH_3$) gas or a nitrogen ($N_2$) gas. These can be used alone or in a mixture thereof. The nitrogen atoms may be generated from the second reaction gas by thermally treating the second reaction gas at a temperature of about 800° C. to about 1,000° C. and a pressure of about 0.1 Torr to about 0.5 Torr.

In some example embodiments of the present invention, the second oxidation process may include a second radical oxidation process, a clean oxidation process or a dry oxidation process.

In an example embodiment of the present invention, the upper oxide layer may be formed in accordance with a reaction between silicon included in the second preliminary oxide layer and a second oxygen radical generated from a third reaction gas including a hydrogen ($H_2$) gas and an oxygen ($O_2$) gas.

In an example embodiment of the present invention, the upper oxide layer may be formed in accordance with a reaction between silicon included in the second preliminary oxide layer and oxygen generated from a third reaction gas including an oxygen ($O_2$) gas and a hydrogen chloride (HCl) gas. The oxygen may be formed by thermally treating the third reaction gas at a temperature of about 800° C. to about 1,000° C. and a pressure of about 0.1 Torr to about 0.5 Torr.

In an example embodiment of the present invention, the upper oxide layer may be formed in accordance with a reaction between silicon included in the second preliminary oxide layer and an oxygen generated from a third reaction gas including an oxygen ($O_2$) gas. The oxygen may be formed by thermally treating the third reaction gas at a temperature of about 800° C. to about 1,000° C. and a pressure of about 5.0 Torr to about 10.0 Torr.

In some example embodiments of the present invention, the first oxidation process, the nitration process and the second oxidation process may be performed in-situ.

In formations of the at least one oxide layer and the at least one nitride layer according to some example embodiments of the present invention, the oxidation process may be performed to form a first preliminary oxide layer on the object by partially oxidizing the object. A first nitration process may be executed to simultaneously form a lower nitride layer from a lower portion of the first preliminary oxide layer on the object, and a second preliminary oxide layer from the first preliminary oxide layer on the lower nitride layer. A second nitration process may be carried out to simultaneously form an oxide layer from the second preliminary oxide layer on the lower nitride layer, and an upper nitride layer from an upper portion of the second preliminary oxide layer on the oxide layer.

In an example embodiment of the present invention, the oxidation process may include a radical oxidation process.

In an example embodiment of the present invention, the first nitration process may include a thermal nitration process.

In an example embodiment of the present invention, the second nitration process may include a plasma nitration process.

In an example embodiment of the present invention, the upper nitride layer may be formed in accordance with a reaction between silicon included in the second preliminary oxide layer and a nitrogen plasma generated from a reaction gas including nitrogen. The reaction gas including nitrogen may include a nitrogen ($N_2$) gas and/or an ammonia ($NH_3$) gas. The nitrogen plasma may be generated by applying a power of about 1,000 W to about 2,000 W to the reaction gas including nitrogen at a temperature of about 400° C. to about 600° C. and a pressure of about 0.5 Torr to about 1.5 Torr.

In an example embodiment of the present invention, the upper nitride layer may be thermally treated using a reaction gas that includes a nitrogen ($N_2$) gas and/or a nitrogen monoxide (NO) gas. The upper nitride layer may be thermally treated at a temperature of about 800° C. to about 1,000° C. and a pressure of about 5.0 Torr to about 15.0 Torr.

In an example embodiment of the present invention, the oxidation process, the first nitration process and the second nitration process may be performed in-situ.

In formations of the at least one oxide layer and the at least one nitride layer according to some example embodiments of the present invention, a first oxidation process and the nitration process may be simultaneously performed to form a preliminary oxide layer on the object by partially oxidizing the object, and a preliminary nitride layer beneath the preliminary oxide layer by changing a lower portion of the preliminary oxide layer, respectively. A second oxidation process may be performed to simultaneously form a nitride layer from the preliminary nitride layer on the object, a lower oxide layer from the preliminary oxide layer on the nitride layer, and an upper oxide layer from the preliminary oxide layer on the lower oxide layer.

In an example embodiment of the present invention, the first oxidation process may include a first dry oxidation process, and the nitration process may include a thermal nitration process.

In an example embodiment of the present invention, the second oxidation process may include a clean oxidation process or a second dry oxidation process.

In an example embodiment of the present invention, the first oxidation process, the nitration process and the second oxidation process may be performed in-situ.

In formations of the at least one oxide layer and the at least one nitride layer according to some example embodiments of the present invention, a first oxidation process may be performed to form a first preliminary oxide layer on the object by partially oxidizing the object. A first nitration process may be performed to simultaneously form a preliminary lower oxide layer from a lower portion of the first preliminary oxide layer on the object, and a second preliminary oxide layer from the first preliminary oxide layer on the preliminary nitride layer. A second oxidation process may be carried out to simultaneously form a lower nitride layer from the preliminary nitride layer on the object, a lower oxide layer from the second preliminary oxide layer on the lower nitride layer, and a preliminary upper oxide layer from the second preliminary oxide layer on the lower oxide layer. A second nitration process may be executed to simultaneously form an upper oxide layer from the preliminary upper oxide layer on the lower oxide layer, and an upper nitride layer on the upper oxide layer by changing an upper portion of the preliminary upper oxide layer.

In an example embodiment of the present invention, the first oxidation process may include a first radical oxidation process, and the first nitration process may include a thermal nitration process. Further, the second oxidation process may include a second radical oxidation process, and the second nitration process may include a plasma nitration process.

In an example embodiment of the present invention, the upper nitride layer may be thermally treated.

In an example embodiment of the present invention, the first oxidation process, the first nitration process, the second oxidation process and the second nitration process may be performed in-situ.

In formations of the at least one oxide layer and the at least one nitride layer according to some example embodiments of the present invention, a first oxidation process and a first nitration process may be simultaneously performed to form a preliminary lower oxide layer on the object by partially oxidizing the object and a preliminary lower nitride layer beneath the preliminary oxide layer by changing a lower portion of the preliminary lower oxide layer, respectively. A second oxidation process may be executed to simultaneously form a lower nitride layer from the preliminary lower nitride layer on the object, a lower oxide layer from the preliminary lower oxide layer on the lower nitride layer, and a preliminary upper oxide layer from the preliminary lower oxide layer on the lower oxide layer. A second nitration process may be carried out to simultaneously form an upper oxide layer from the preliminary upper oxide layer on the lower oxide layer, and an upper nitride layer on the upper oxide layer by changing an upper portion of the preliminary upper oxide layer.

In an example embodiment of the present invention, the first oxidation process may include a first dry oxidation process, and the first nitration process may include a thermal nitration process. Additionally, the second oxidation process may include a second dry oxidation process or a clean oxidation process, and the second nitration process may include a plasma nitration process.

In an example embodiment of the present invention, the upper nitride layer may be thermally treated.

According to another aspect of the present invention, there is provided a method of forming an insulation structure. In the method of forming the insulation structure, an oxide layer is formed on an object by a first oxidation process. A preliminary oxynitride layer is formed from the oxide layer on the object by a nitrogen annealing process. An oxynitride layer is formed from the preliminary oxynitride layer on the object by a second oxidation process.

In an example embodiment of the present invention, the oxide layer may be formed using a first reaction gas including oxygen.

In an example embodiment of the present invention, the preliminary oxynitride layer may be formed using a second reaction gas including nitrogen.

In an example embodiment of the present invention, the second reaction gas may include a nitrogen ($N_2$) gas, an ammonia ($NH_3$) gas, a nitrogen monoxide (NO) gas and/or a nitrous oxide ($N_2O$) gas.

In an example embodiment of the present invention, the oxynitride layer may be formed using a third reaction gas including oxygen and hydrogen chloride.

According to still another aspect of the present invention, there is provided a method of manufacturing a semiconductor device. In the method of manufacturing the semiconductor device, isolation layer patterns are formed on a substrate. Each of the isolation layer patterns has a lower portion buried in the substrate and an upper portion protruding from the substrate. An insulation structure is formed on a portion of the substrate between the isolation layer patterns. The insulation structure includes at least one oxide layer formed by at least one oxidation process and at least one nitride layer formed by at least one nitration process. A floating gate is formed on the insulation structure. After a dielectric layer is formed on the floating gate, a control gate is formed on the dielectric layer.

In a formation of the insulation structure according to some example embodiments of the present invention, a first oxidation process may be performed to form a first preliminary oxide layer on the substrate by partially oxidizing the substrate. The nitration process may be carried out to simultaneously form a preliminary nitride layer on the substrate by changing a lower portion of the oxide layer, and a second preliminary oxide layer from the first preliminary oxide layer on the preliminary nitride layer. A second oxidation process may be executed to simultaneously form the nitride layer from the preliminary nitride layer on the substrate, a lower oxide layer from the second preliminary oxide layer on the nitride layer, and an upper oxide layer from the second preliminary oxide layer on the lower oxide layer.

In a formation of the insulation structure according to some example embodiments of the present invention, the oxidation process may be executed to form a first preliminary oxide layer on the substrate by partially oxidizing the substrate. A first nitration process may be carried out to simultaneously form a lower nitride layer on the substrate by changing a lower portion of the first preliminary oxide layer, and a second preliminary oxide layer from the first preliminary oxide layer on the lower nitride layer. A second nitration process may be performed to simultaneously form an oxide layer from the second preliminary oxide layer on the lower nitride layer, and an upper nitride layer on the oxide layer by changing an upper portion of the second preliminary oxide layer.

In a formation of the insulation structure according to some example embodiments of the present invention, a first oxidation process and the nitration process may be simultaneously performed to form a preliminary oxide layer on the substrate by partially oxidizing the substrate and a preliminary nitride layer beneath the preliminary oxide layer by changing a lower portion of the preliminary oxide layer, respectively. A second oxidation process may be carried out to simultaneously form a nitride layer from the preliminary nitride layer on the substrate, a lower oxide layer from the preliminary oxide layer on the nitride layer, and an upper oxide layer from the preliminary oxide layer on the lower oxide layer.

In a formation of the insulation structure according to some example embodiments of the present invention, a first oxidation process may be executed to form a first preliminary oxide layer on the substrate by partially oxidizing the substrate. A first nitration process may be performed to simultaneously form a preliminary lower oxide layer on the substrate by changing a lower portion of the first preliminary oxide layer, and a second preliminary oxide layer from the first preliminary oxide layer on the preliminary nitride layer. A second oxidation process may be carried out to simultaneously form a lower nitride layer from the preliminary nitride layer on the substrate, a lower oxide layer from the second preliminary oxide layer on the lower nitride layer, and a preliminary upper oxide layer from the second preliminary oxide layer on the lower oxide layer. A second nitration process may be carried out to simultaneously form an upper oxide layer from the preliminary upper oxide layer on the lower oxide layer, and an upper nitride layer on the upper oxide layer by changing an upper portion of the preliminary upper oxide layer.

In a formation of the insulation structure according to some example embodiments of the present invention, a first oxidation process and a first nitration process may be simultaneously performed to form a preliminary lower oxide layer on the substrate by partially oxidizing the substrate and a preliminary lower nitride layer beneath the preliminary oxide layer by changing a lower portion of the preliminary lower oxide layer, respectively. A second oxidation process may be carried out to simultaneously form a lower nitride layer from the preliminary lower nitride layer on the substrate, a lower oxide layer from the preliminary lower oxide layer on the lower nitride layer, and a preliminary upper oxide layer from the preliminary lower oxide layer on the lower oxide layer. A second nitration process may be executed to simultaneously form an upper oxide layer from the preliminary upper oxide layer on the lower oxide layer, and an upper nitride layer on the upper oxide layer by changing an upper portion of the preliminary upper oxide layer.

According to still another aspect of the present invention, there is provided a method of manufacturing a semiconductor device. In the method of manufacturing the semiconductor device, isolation layer patterns are formed on a substrate. Each of the isolation layer patterns has a lower portion buried in the substrate and an upper portion protruding from the substrate. An insulation structure is formed on a portion of the substrate between the isolation layer patterns. The insulation structure includes at least one oxynitride layer formed by at least one oxidation process and at least one nitrogen annealing process. After a floating gate is formed on the insulation structure, a dielectric layer and a control gate are sequentially formed on the floating gate.

In a formation of the insulation structure according to some example embodiments of the present invention, a first oxidation process may be carried out to form an oxide layer on the substrate. The nitrogen annealing process may be performed to form a preliminary oxynitride layer from the oxide layer on the substrate. A second oxidation process may be executed to form the oxynitride layer from the preliminary oxynitride layer.

According to the present invention, an insulation structure including at least one oxide layer, at least one nitride layer and/or at least one oxynitride layer may be obtained by at least one oxidation process and at least one nitration process. The nitride layer and oxynitride layers may be formed from a portion of the oxide layer by a nitration process or a nitrogen annealing process. A peripheral portion of the insulation structure including an edge portion may have a thickness substantially the same as that of a central portion of the insulation structure so that the insulation structure may have a uniform thickness and enhanced electrical characteristics. When the insulation structure is employed as a tunnel insulation layer or a gate insulation layer in a semiconductor device, the semiconductor device may have an improved endurance and desired electrical characteristics because memory cells of the semiconductor device may have a uniform distribution of threshold voltages. Since nitrogen atoms may be uniformly distributed in the insulation structure, charge trapping sites generated in the insulation structure may be considerably reduced. Therefore, the semiconductor device including the insulation structure may have more improved endurance and reliability.

BRIEF DESCRIPTION OF THE DRAWINGS

The above and other features and advantages of the present invention will become more apparent by describing in detailed example embodiments thereof with reference to the accompanying drawings, in which.

DESCRIPTION OF THE EMBODIMENTS

Figure 1:
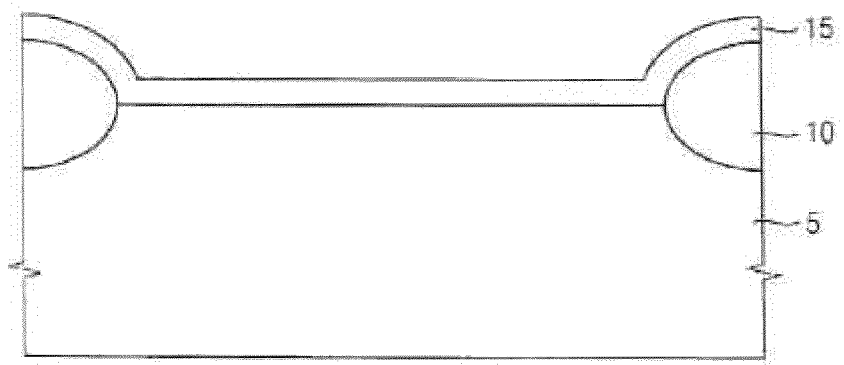
FIGS. 1 to 5 are cross-sectional views illustrating a method of manufacturing a conventional semiconductor device.
Figure 2:
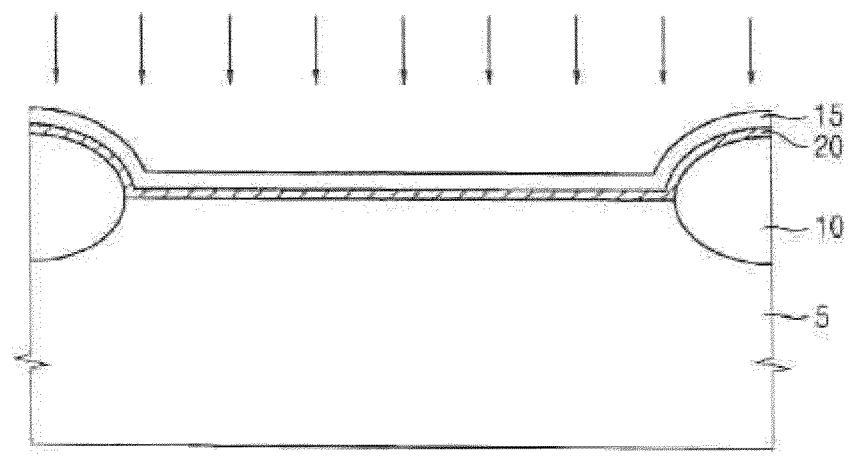
Figure 3:
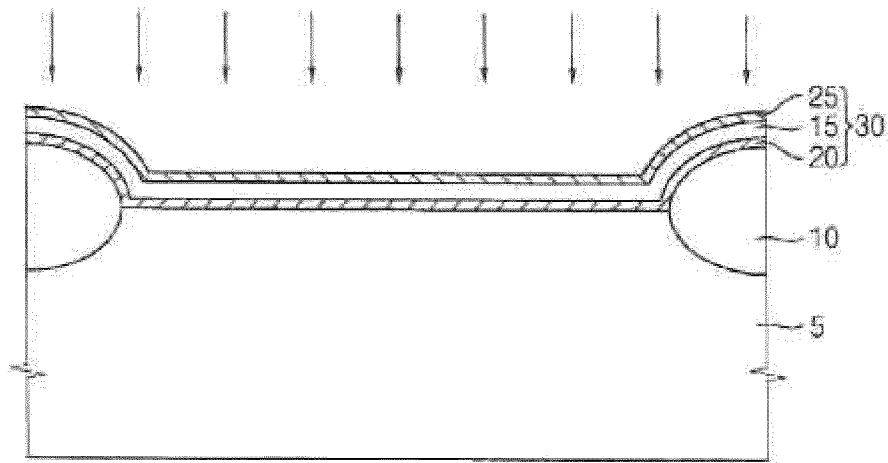
Figure 4:
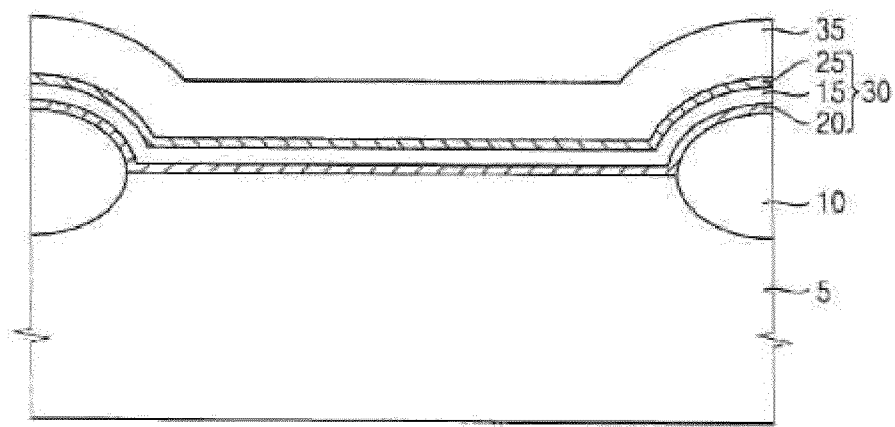
Figure 5:
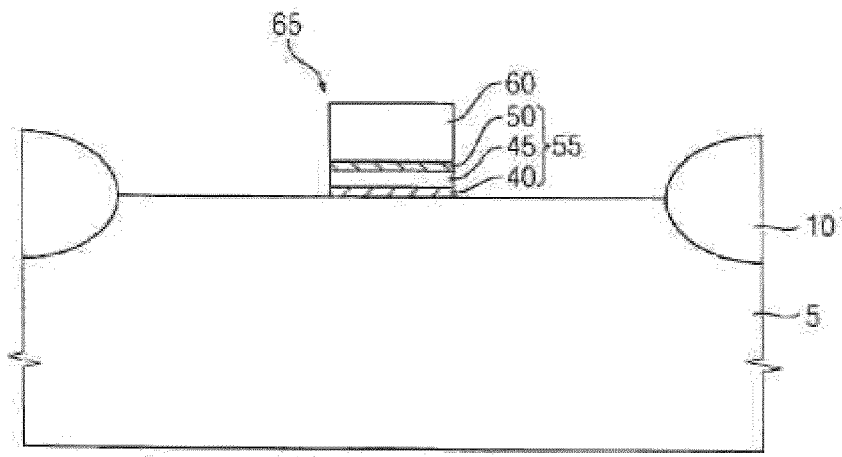

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Method of Forming an Insulation Structure

Figure 6:
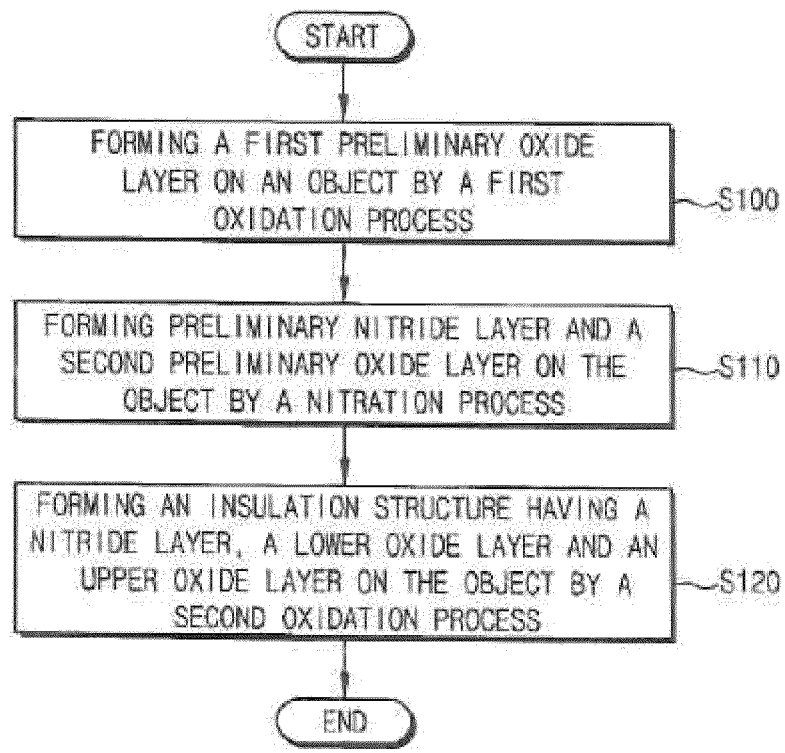
FIG. 6 is a flow chart illustrating a method of forming an insulation structure in accordance with example embodiments of the present invention.
Figure 7:
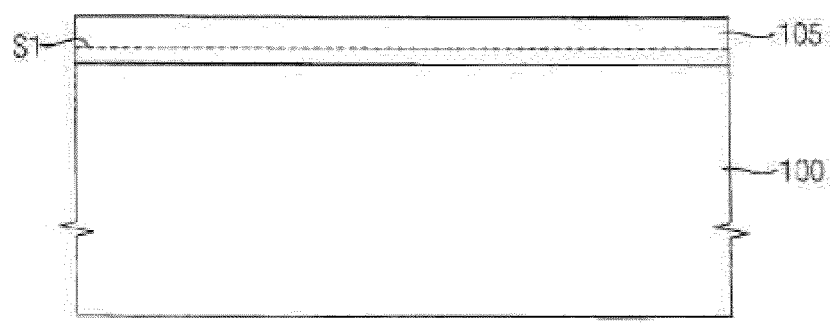
FIGS. 7 to 9 are cross-sectional views illustrating a method of forming an insulation structure in accordance with example embodiments of the present invention.
Figure 8:
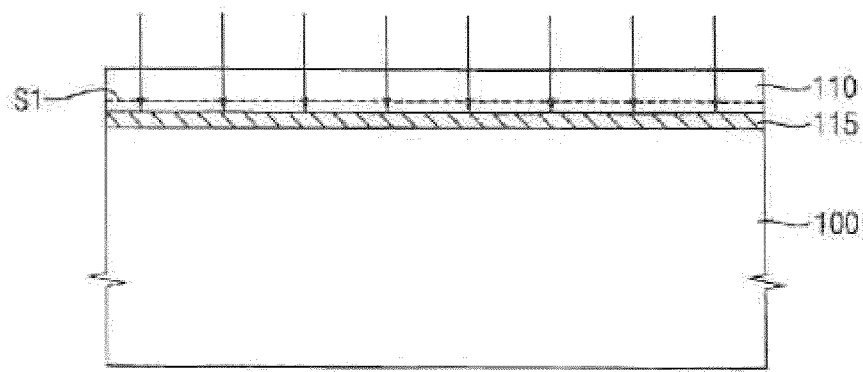
Figure 9:
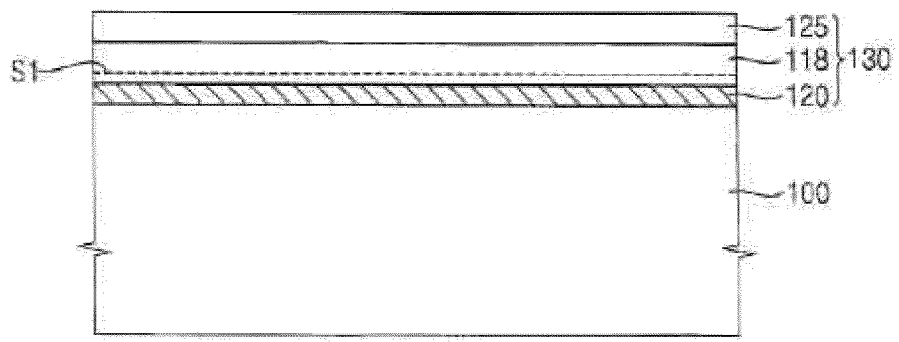

FIG. 6 is a flow chart illustrating a method of forming an insulation structure in accordance with example embodiments of the present invention. FIGS. 7 to 9 are cross-sectional views illustrating a method of forming an insulation structure in accordance with example embodiments of the present invention.

Referring to FIGS. 6 and 7, a first preliminary oxide layer 105 is formed on an object 100 by a first oxidation process in step S100. The object 100 may include a semiconductor substrate, for example, a silicon substrate, a germanium substrate, silicon germanium substrate, a silicon-on-insulator (SOI) substrate, etc. Alternatively, the object 100 may include a metal oxide substrate such as an aluminum oxide substrate, a strontium ruthenium oxide substrate, etc.

A lower structure may be formed on the object 100. The lower structure may include a contact region, a pad, an insulation layer, an insulation pattern, a conductive layer, a conductive pattern, a gate structure and/or a transistor.

When the object 100 includes silicon, the first preliminary oxide layer 105 may include silicon oxide because the first preliminary oxide layer 105 may be formed by the first oxidation process. The first oxidation process may include a first radical oxidation process.

In an example embodiment of the present invention, the object 100 may be loaded into a process chamber, and then a first reaction gas may be provided onto the object 100 in the first radical oxidation process. The first reaction gas may include a hydrogen ($H_2$) gas and an oxygen ($O_2$) gas. The process chamber may have a relatively high first temperature and a relatively low first pressure during the first radical oxidation process. The process chamber may have the relatively high first temperature of about 800° C. to about 1,000° C. and the relatively low first pressure of about 0.1 Torr to about 0.5 Torr. For example, the first oxidation process may be carried out at the relatively high first temperature of about 900° C. and the relatively low first pressure of about 0.3 Torr.

In the process chamber having the relatively high first temperature and the relatively low first pressure, first oxygen radicals (O*) may be generated over the object 100 by a reaction between the hydrogen gas and the oxygen gas in the first reaction gas. Particularly, the first reaction gas may be thermally treated at the relatively high first temperature and the relatively low first pressure so that the first oxygen radicals may be formed in the process chamber. The hydrogen gas may be introduced into the process chamber at a flow rate of about 2.0 slm to about 3.0 slm. The oxygen gas may be provided into the process chamber by about 0.1 slm to about 0.5 slm. Thus, a flow rate ratio between the hydrogen gas and the oxygen gas may be in a range of about 1.0:4.0 to 30.0. In addition, the first reaction gas containing the hydrogen and the oxygen gases may be provided onto the object 100 for about 10 minutes to about 30 minutes. For example, the first reaction gas may be introduced into the process chamber for about 20 minutes.

The first oxygen radicals may be reacted with silicon included in the object 100 to thereby form the first preliminary oxide layer 105 including silicon oxide on the object 100. In other words, an upper portion of the object 100 including silicon may be reacted with the first oxygen radicals so that the first preliminary oxide layer 105 is formed on the object 100. The first preliminary oxide layer 105 may have a predetermined thickness centering an initial surface S1 of the object 100. That is, the first preliminary oxide layer 105 may be formed slightly over the initial surface S1 of the object 100 and slightly below the initial surface S1 of the object 100.

In example embodiments of the present invention, the first oxygen radicals may be generated over the object 100 by a direct plasma process or a remote plasma process, and then the first oxygen radicals may be reacted with silicon included in the object 100 to form the first preliminary oxide layer 105 on the object 100.

After a formation of the first preliminary oxide layer 105, a first purge process is performed to purge the process chamber. The process chamber is purged using a first purge gas in the first purge process. The first purge gas may include an inactive gas including an argon (Ar) gas, a nitrogen ($N_2$) gas and/or a helium (He) gas. The first purge gas may be introduced into the process chamber for about 1 minute to about 3 minutes at a flow rate of about 0.5 slm to about 4.5 slm. In an example embodiment of the present invention, the first purge gas including the nitrogen gas may be introduced into the process chamber for about 2 minutes.

Referring to FIGS. 6 and 8, a preliminary nitride layer 115 and a second preliminary oxide layer 110 are formed on the object 100 by a nitration process in step S110. The nitration process may include a thermal nitration process.

In the thermal nitration process, a second reaction gas including nitrogen may be provided onto the first preliminary oxide layer 105 while a process chamber may have a relatively high second temperature and a relatively high second pressure. The relatively high second temperature may be in a range of about 800° C. to about 1,000° C. and the relatively high second pressure may be in a range of about 5.0 Torr to about 15.0 Torr. In an example embodiment of the present invention, the thermal nitration process may be performed at the relatively high second temperature of about 900° C. and the relatively high second pressure of about 10.0 Torr. The second reaction gas may be introduced into the process chamber for about 5 minutes to about 20 minutes. For example, the second reaction gas may be provided onto the object 100 for about 10 minutes.

In one example embodiment of the present invention, the second reaction gas may include a nitrogen monoxide (NO) gas. The second reaction gas may be provided onto the first preliminary oxide layer 105 for about 5 minutes to about 20 minutes at a flow rate of about 0.5 slm to about 1.5 slm. For example, the second reaction gas may be introduced into the process chamber for about 10 minutes at a flow rate of about 10 minutes. In another example embodiment of the present invention, the second reaction gas may include a nitrous oxide ($N_2O$) gas. In still another example embodiment of the present invention, the second reaction gas may include an ammonia ($NH_3$) gas. In still another example embodiment of the present invention, the second reaction gas may include a nitrogen gas. In other example embodiments of the present invention, the second reaction gas may include more than two of the nitrogen monoxide (NO) gas, the nitrous oxide ($N_2O$) gas, the ammonia ($NH_3$) gas and the nitrogen ($N_2$) gas. For example, the second reaction gas may include the nitrogen monoxide (NO) gas and the nitrogen gas ($N_2$), or the nitrogen monoxide (NO) gas and the ammonia ($NH_3$) gas. Alternatively, the second reaction gas may include the nitrogen monoxide gas, the nitrogen gas and the nitrous oxide gas.

When the second reaction gas includes the nitrogen monoxide gas and the nitrogen gas, the nitrogen monoxide gas and the nitrogen gas may be provided onto the first preliminary oxide layer 105 at a flow rate of about 0.3 slm to about 1.0 slm and a flow rate of about 0.5 slm to about 4.0 slm, respectively. Thus, a flow rate ratio between the nitrogen monoxide gas and the nitrogen gas may be in a range of about 1.0:0.5 to about 13.5.

In the above-described thermal nitration process, nitrogen atoms in the second reaction gas are accumulated at a lower portion of the first preliminary oxide layer 105 as shown in FIG. 8. Therefore, the preliminary nitride layer 115 is formed between the object 100 and the first preliminary oxide layer 105. When the first preliminary oxide layer 105 includes silicon oxide, the preliminary nitride layer 115 includes silicon nitride. That is, the lower portion of the first preliminary oxide layer 105 is changed into the preliminary nitride layer 115 in accordance with the accumulation of the nitrogen atoms at the lower portion of the first preliminary oxide layer 105. As the preliminary nitride layer 115 is formed from the lower portion of the first preliminary oxide layer 105, the first preliminary oxide layer 105 is changed into the second preliminary oxide layer 110. The second preliminary oxide layer 110 may have a thickness substantially thinner than that of the first preliminary oxide layer 105 by a thickness of the preliminary nitride layer 115.

After formations of the preliminary nitride layer 115 and the second preliminary oxide layer 110, a second purge process is carried out to purge the process chamber. The second purge process is performed using a second purge gas. The second purge gas may include an inactive gas including an argon (Ar) gas, a nitrogen ($N_2$) gas, a helium (He) gas and/or a nitrogen ($N_2$) gas. The second purge gas may be introduced into the process chamber for about 1 minute to about 3 minutes at a flow rate of about 0.5 slm to about 4.5 slm. In an example embodiment, the second reaction gas including the nitrogen gas may be introduced into the process chamber for about 2 minutes.

Referring to FIGS. 6 and 9, an insulation structure 130 is formed on the object 100 by a second oxidation process in step S120. The insulation structure 130 includes a nitride layer 120, a lower oxide layer 118 and an upper oxide layer 125 sequentially formed on the object 100.

In the second oxidation process, nitrogen atoms in the preliminary nitride layer 115 may be diffused into the object 100 so that the nitride layer 120 is formed on the object 100. Thus, the nitride layer 120 may have a thickness substantially thicker than that of the preliminary nitride layer 115. Additionally, silicon included in the second preliminary oxide layer 110 may be reacted with second oxygen radicals or oxygen to form the upper oxide layer 125 on the second preliminary oxide layer 110 during the second oxidation process. The upper oxide layer 125 may extend beneath a surface of the second preliminary oxide layer 110. Thus, an upper portion of the second preliminary oxide layer 110 may be partially changed into a lower portion of the upper oxide layer 125. As a result, the second preliminary oxide layer 110 is changed into the lower oxide layer 118. The lower oxide layer 118 may have a thickness slightly thinner than that of the second preliminary oxide layer 110. As the upper oxide layer 125 is generated from the second preliminary oxide layer 110, the upper oxide layer 125 may have a thickness substantially thinner than that of the lower oxide layer 118.

In one example embodiment of the present invention, the second oxidation process may include a second radical oxidation process. In the second radical oxidation process, a third reaction gas may be introduced into a process chamber after the object 100 is loaded into the process chamber. The third reaction gas may include a hydrogen gas and an oxygen gas. The process chamber may be maintained with a relatively high third temperature and a relatively low third pressure. For example, the relatively high third temperature may be in a range of about 800° C. to about 1,000° C. and the relatively low third pressure may be in a range of about 0.1 Torr to about 0.5 Torr. The second oxygen radicals may be generated by a reaction between the hydrogen gas and the oxygen gas in the third reaction gas while the process chamber may have the relatively high third temperature and the relatively low third pressure. Namely, the third reaction gas may be thermally treated to generate the second oxygen radicals. The hydrogen gas and the oxygen gas may be introduced into the process chamber at a flow rate of about 2.0 slm to about 3.0 slm and a flow rate of about 0.1 slm to about 0.5 slm, respectively. Hence, a flow rate ratio between the hydrogen gas and the oxygen gas may be in a range of about 1.0:4.0 to 30.0. The third reaction gas including the hydrogen and the oxygen gases may be provided onto the second preliminary oxide layer 110 for about 10 minutes to about 30 minutes. For example, the third reaction gas may be introduced into the process chamber for about 20 minutes. When the second oxygen radicals generated from the third reaction gas are reacted with silicon in the second preliminary oxide layer 110, the second preliminary oxide layer 110 is changed into the lower oxide layer 118, and the upper oxide layer 125 is simultaneously formed on the lower oxide layer 118. Here, the nitrogen atoms in the preliminary nitride layer 115 may be diffused into the object 100, thereby forming the nitride layer 120 on the object 100. Thus, the nitride layer 120 may have the thickness substantially thicker than that of the preliminary nitride layer 115. The second oxygen radicals may be formed by a direct plasma process or a remote plasma process.

In another example embodiment of the present invention, the second oxidation process may include a clean oxidation process. In the clean oxidation process, a third reaction gas may be introduced into a process chamber having a relatively high third temperature and a relatively low third pressure. The third reaction gas may include a hydrogen chloride (HCl) gas and an oxygen gas. The relatively high third temperature may be in a range of about 800° C. to about 1,000° C. and the relatively low third pressure may be in a range of about 0.1 Torr to about 0.5 Torr. A flow rate ratio between the oxygen gas and the hydrogen chloride gas may be in a range of about 9.9:0.1. When the third reaction gas includes above about 4 percent by weight of the hydrogen chloride gas, the object 100, the second preliminary oxide layer 110 and/or the process chamber may be damaged by the third reaction gas. Hence, the third reaction gas may include about 1 to about 3 percent by weight of the hydrogen chloride gas. In the clean oxidation process, clean oxide may be generated in accordance with a reaction between the hydrogen chloride gas and the oxygen gas in the third reaction gas. The clean oxygen may be reacted with silicon in the second preliminary oxide layer 110 so that the second preliminary oxide layer 110 may be changed into the lower oxide layer 118, and the upper oxide layer 125 may be simultaneously formed on the lower oxide layer 118.

In still another example embodiment of the present invention, the second oxidation process may include a dry oxidation process. In the dry oxidation process, after a process chamber may be maintained with a relatively high third temperature and a relatively high third pressure, a third reaction gas may be introduced into the process chamber. The relatively high third temperature may be in a range of about 800° C. to about 1,000° C. and the relatively high third pressure may be in a range of about 5.0 Torr to about 10.0 Torr. The third reaction gas may include an oxygen gas only. The third reaction gas may be introduced into the process chamber at a flow rate of about 5.0 slm to about 15.0 slm. After generating oxygen by thermally treating the third reaction gas, oxygen may be reacted with silicon in the second preliminary oxide layer 110, thereby converting the second preliminary oxide layer 110 into the lower oxide layer 118 and simultaneously forming the upper oxide layer 125 on the lower oxide layer 118.

In some example embodiments of the present invention, the first oxidation process, the nitration process and the second oxidation process may be carried out in-situ using one process chamber so as to form the insulation structure 130 on the object 100.

In a conventional method of manufacturing a non-volatile semiconductor device, a large number of silicon-hydrogen (Si—H) bonds, which corresponds to charge trapping sites capable of trapping charges in a programming operation and an erasing operation, may be generated in a tunnel insulation layer when the tunnel insulation layer is formed on a silicon substrate by a radical oxidation process using oxygen radicals generated with an assistance of a hydrogen gas. Thus, a large amount of charges that may be trapped in the charge trapping sites of the tunnel insulation layer during the programming and erasing operations considerably deteriorate characteristics of the non-volatile semiconductor device such as endurance and reliability thereof.

According to some example embodiments of the present invention, the nitrogen atoms may be accumulated at the lower portion of the first preliminary oxide layer 105 so that the lower portion of the first preliminary oxide layer 105 may be changed into the preliminary nitride layer 115. Thus, generations of charge trapping sites in the preliminary nitride layer 115 and the second preliminary oxide layer 110 may be effectively prevented. Additionally, the nitration process may efficiently reduce a stress concentrated at a peripheral portion of the first preliminary oxide layer 105, particularly an edge portion of the first preliminary oxide layer 105. Therefore, the peripheral portion of the first preliminary oxide layer 105 including the edge portion may have a thickness substantially the same or slightly thicker than that of a central portion of the first preliminary oxide layer 105.

When a growth of the first preliminary oxide layer 105 formed on the object 100 is abruptly interrupted, a relatively large number of silicon ions may be generated in the central portion of the first preliminary oxide layer 105. However, a relatively large number of silicon-oxygen-nitrogen (Si—O—H) bonds may be generated in the central portion of the first preliminary oxide layer 105 when the nitration process is performed on the first preliminary oxide layer 105. Hence, a stress generated at the central portion of the first preliminary oxide layer 105 may be increased. When the second radical oxidation process may be performed on the first preliminary oxide layer 105 having the stressed central portion, central portions of the lower oxide layer 118 and the upper oxide layer 125 may have stresses substantially the same as those generated at peripheral portions of the lower and the upper oxide layers 118 and 125 including edge portions thereof. Accordingly, the insulation structure 130 may have a peripheral portion including an edge having a thickness substantially the same or slightly thicker than that of a central portion of the insulation structure 130. Furthermore, since the lower and the upper oxide layers 118 and 125 may be formed by the clean oxidation process or the dry oxidation process, silicon-hydrogen bonds in the insulation structure 130 may be greatly decreased while preventing a thinning of the edge portion of the insulation structure 130. As a result, the insulation structure 130 may have much improved electrical characteristics and a greatly uniform thickness.

Figure 10:
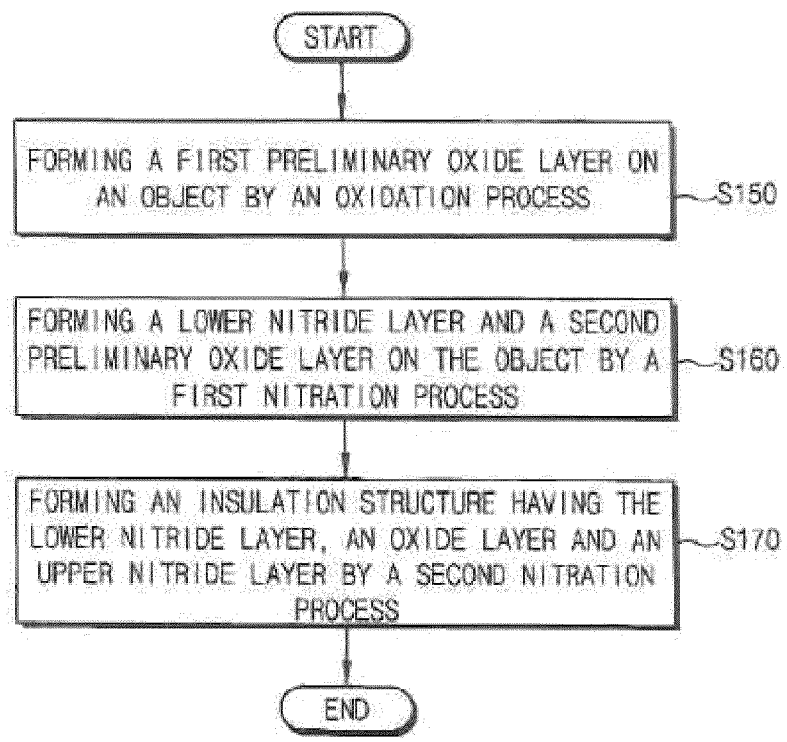
FIG. 10 is a flow chart illustrating a method of forming an insulation structure in accordance with example embodiments of the present invention.
Figure 11:
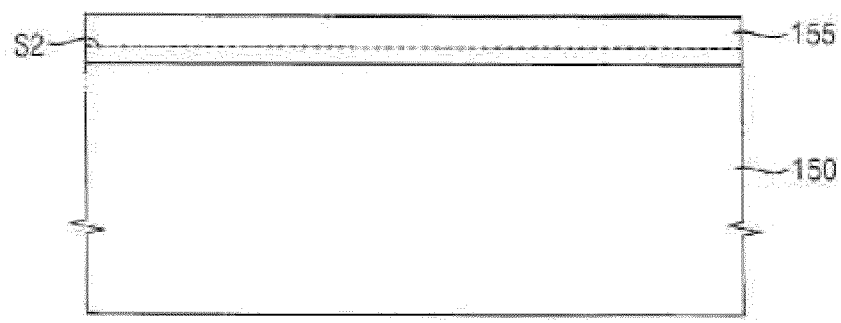
FIGS. 11 to 13 are cross-sectional views illustrating a method of forming an insulation structure in accordance with example embodiments of the present invention.
Figure 12:
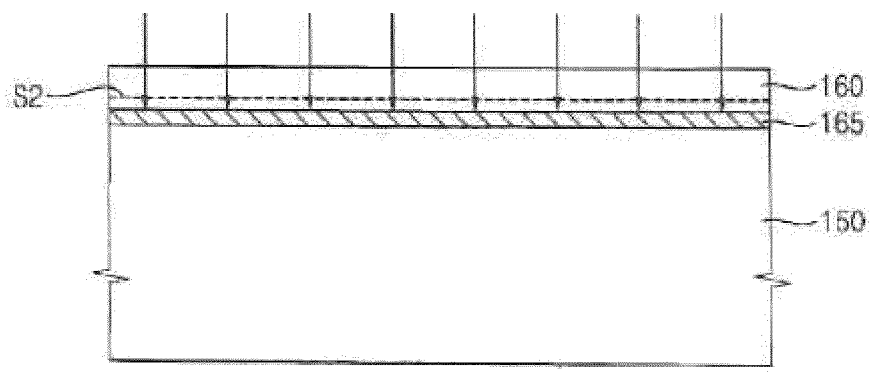
Figure 13:
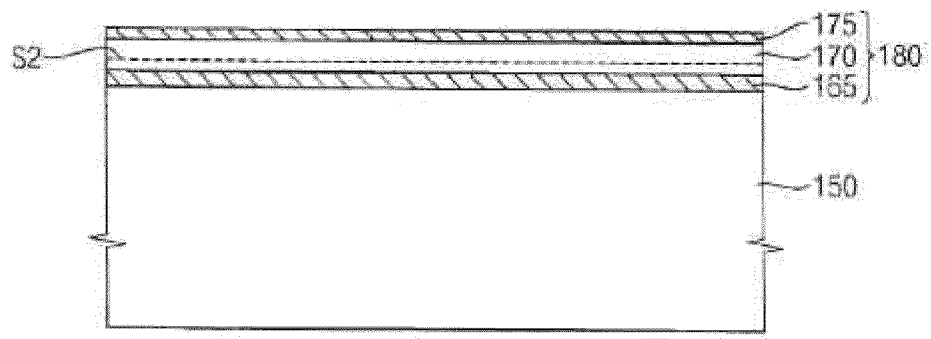

FIG. 10 is a flow chart illustrating a method of forming an insulation structure in accordance with example embodiments of the present invention. FIGS. 11 to 13 are cross-sectional views illustrating a method of forming an insulation structure in accordance with example embodiments of the present invention.

Referring to FIGS. 10 and 11, a first preliminary oxide layer 155 is formed on an object 150 by an oxidation process in step S150. The object 150 may include a substrate including silicon, for example, a silicon substrate, a silicon germanium substrate, an SOI substrate, etc. The first preliminary oxide layer 155 may include silicon oxide. A lower structure (not shown) may be provided on the object 150. The lower structure may include a contact region, a pad, an insulation layer, an insulation pattern, a conductive layer, a conductive pattern, a gate structure and/or a transistor. In some example embodiments, the oxidation process for forming the first preliminary oxide layer 155 may include a radical oxidation process.

In an example embodiment of the present invention, the object 150 may be loaded into a process chamber having a relatively high first temperature and a relatively low first pressure, and then a first reaction gas including an oxygen gas and a hydrogen gas may be provided onto the object 150 in the oxidation process. For example, the relatively high first temperature may be in a range of about 800° C. to about 1,000° C. and the relatively low first pressure may be in a range of about 0.1 Torr to about 0.5 Torr.

In the process chamber having the relatively high first temperature and the relatively low first pressure, the hydrogen and the oxygen gases in the first reaction gas may be reacted each other to generate oxygen radicals (O*) over the object 150. That is, the first reaction gas may be thermally treated at the relatively high first temperature and the relatively low first pressure, thereby generating the oxygen radicals over the object 150 in the process chamber. The hydrogen gas may be introduced into the process chamber at a flow rate of about 2.0 slm to about 3.0 slm, and the oxygen gas may be provided into the process chamber by about 0.1 slm to about 0.5 slm. Thus, a flow rate ratio between the hydrogen gas and the oxygen gas may be in a range of about 1.0:4.0 to 30.0. The first reaction gas including the hydrogen and the oxygen gases may be provided onto the object 150 for about 10 minutes to about 30 minutes.

The oxygen radicals generated from the first reaction gas may be reacted with silicon included in the object 150 so that the first preliminary oxide layer 155 including silicon oxide is formed on the object 150. As described above, an upper portion of the object 150 including silicon may be reacted with the oxygen radicals to form the first preliminary oxide layer 155 such that the first preliminary oxide layer 155 may have a predetermined thickness centering an initial surface S2 of the object 150. Namely, the first preliminary oxide layer 155 may be formed over the initial surface S2 of the object 100 and below the initial surface S2 of the object 150.

In some example embodiments of the present invention, after the oxygen radicals may be generated over the object 150 by a direct plasma process or a remote plasma process, the oxygen radicals may be reacted with silicon included in the object 150, to thereby form the first preliminary oxide layer 155 on the object 150.

After the first preliminary oxide layer 155 is formed on the object 150, a first purge process is performed to purge the process chamber. The first purge process may be carried out using a first purge gas that includes an inactive gas such as an argon (Ar) gas, a nitrogen ($N_2$) gas, a helium (He) gas, etc. These can be used alone or in a mixture thereof. For example, the first purge gas may be provided into the process chamber for about 1 minute to about 3 minutes at a flow rate of about 0.5 slm to about 4.5 slm.

Referring to FIGS. 10 and 12, a lower nitride layer 165 and a second preliminary oxide layer 160 are formed on the object 150 by a first nitration process in step S160. The first nitration process may include a thermal nitration process. In the thermal nitration process, a second reaction gas including nitrogen may be provided onto the object 150 having the first preliminary oxide layer 155 after a process chamber may have a relatively high second temperature and a relatively high second pressure. The relatively high second temperature may be in a range of about 800° C. to about 1,000° C. and the relatively high second pressure may be in a range of about 5.0 Torr to about 15.0 Torr. The second reaction gas may be introduced into the process chamber for about 5 minutes to about 20 minutes.

In one example embodiment of the present invention, the second reaction gas may include a nitrogen monoxide gas. The second reaction gas may be provided onto the first preliminary oxide layer 155 at a flow rate of about 0.5 slm to about 1.5 slm. In another example embodiment of the present invention, the second reaction gas may include nitrous oxide gas. In still another example embodiment of the present invention, the second reaction gas may include an ammonia gas. In still another example embodiment of the present invention, the second reaction gas may include a nitrogen gas. In other example embodiments of the present invention, the second reaction gas may include at least two gases among the nitrogen monoxide gas, the nitrous oxide gas, the ammonia gas and the nitrogen gas. For example, the second reaction gas may include the nitrogen monoxide gas and the nitrogen gas, or the nitrogen monoxide gas and the ammonia gas. Alternatively, the second reaction gas may include the nitrogen monoxide gas, the nitrogen gas and the nitrous oxide gas.

When the second reaction gas includes the nitrogen monoxide gas and the nitrogen gas, the nitrogen monoxide gas and the nitrogen gas may be introduced into the process chamber at a flow rate of about 0.3 slm to about 1.0 slm and a flow rate of about 0.5 slm to about 4.0 slm, respectively. Hence, a flow rate ratio between the nitrogen monoxide gas and the nitrogen gas may be in a range of about 1.0:0.5 to about 13.5.

In the above-described thermal nitration process for forming the lower nitride layer 165 and the second preliminary oxide layer 160, nitrogen atoms in the second reaction gas are accumulated at a lower portion of the first preliminary oxide gas 155 as shown in FIG. 8, so that the lower nitride layer 165 is formed between the object 150 and the first preliminary oxide layer 155. When the first preliminary oxide layer 155 includes silicon oxide, the lower nitride layer 165 includes silicon nitride. Namely, the lower portion of the first preliminary oxide layer 155 is converted into the lower nitride layer 165 in accordance with the accumulation of the nitrogen atoms at the lower portion of the first preliminary oxide layer 155. Since the lower nitride layer 165 is formed from the lower portion of the first preliminary oxide layer 155, an upper face of the lower nitride layer 165 may be positioned under an initial surface S2 of the object 150. As a formation of the lower nitride layer 165, the first preliminary oxide layer 155 is changed into the second preliminary oxide layer 160. The second preliminary oxide layer 160 may have a thickness substantially thinner than that of the first preliminary oxide layer 155 by a thickness of the lower nitride layer 165.

After formations of the second preliminary oxide layer 160 and the lower nitride layer 165, a second purge process is performed to purge the process chamber using a second purge gas. The second purge gas may include an inactive gas that includes an argon gas, a nitrogen gas, a helium gas, a nitrogen gas. These can be used alone or in a mixture thereof.

Referring to FIGS. 10 and 13, a second nitration process is carried out to form an insulation structure 180 on the object 150 in step S170. The insulation structure 180 includes the lower nitride layer 165, an oxide layer 170 and an upper nitride layer 175 successively formed on the object 150. The second nitration process may include a plasma nitration process.

In the plasma nitration process, a third reaction gas including nitrogen may be provided onto the object 150 loaded in a process chamber, and then a nitrogen plasma may be generated over the object 150 by applying a power of about 1,000 W to about 2,000 W to the third reaction gas. The nitrogen plasma may be reacted with ingredients included in the second preliminary oxide layer 160 so that the upper nitride layer 175 may be formed on the second preliminary oxide layer 160. When the second preliminary oxide layer 160 includes silicon oxide, the upper nitride layer 175 including silicon nitride may be obtained in accordance with a reaction between the nitrogen plasma and silicon included in the second preliminary oxide layer 160. Since an upper portion of the second preliminary oxide layer 160 is changed into the upper nitride layer 175, the second preliminary oxide layer 160 is converted into the oxide layer 170. The oxide layer 170 may have a thickness substantially thinner than that of the second preliminary oxide layer 160 by a thickness of the upper nitride layer 175.

In the second nitration process, the process chamber may have a relatively low third temperature and a relatively high third pressure. The relatively low third temperature may be in a range of about 400° C. to about 600° C. and the relatively high third pressure may be in a range of about 0.5 Torr to about 1.5 Torr. For example, the process chamber may have the relatively low third temperature of about 500° C. and the relatively high third pressure of about 0.95 Torr. Additionally, the third reaction gas may be introduced into the process chamber for about 1 minute to about 3 minutes. For example, the third reaction gas may be provided onto the second preliminary oxide layer 160 on the object 150 for about 2 minutes. In some example embodiments, the third reaction gas may be introduced into the process chamber together with a carrier gas. The carrier gas may include an inactive gas. For example, the carrier gas may include an argon gas, a nitrogen gas and/or a helium gas. A flow rate ratio between the third reaction gas and the carrier gas may be in a range of about 1.0:10.0 to 15.0.

In one example embodiment of the present invention, the third reaction gas may include a nitrogen gas. In another example embodiment of the present invention, the third reaction gas may include an ammonia gas. In still another example embodiment of the present invention, the third reaction gas may include a nitrogen gas and an ammonia gas.

In some example embodiments of the present invention, a post thermal treatment process may be performed about the insulation structure 180 on the object 150 using a fourth reaction gas so as to dense the upper nitride layer 175 and to uniformly distribute nitrogen atoms in the upper nitride layer 175. The post thermal treatment process may be carried out at a relatively high fourth temperature and a relatively high fourth pressure. For example, the insulation structure 180 may be thermally treated at the relatively high fourth temperature of about 800° C. to about 1,000° C. and the relatively high fourth pressure of about 5.0 Torr to about 15.0 Torr. Further, the insulation structure 180 may be thermally treated for about 5 minutes to about 15 minutes. In an example embodiment, the post thermal treatment process may be executed at the relatively high fourth temperature of about 900° C. and the relatively high fourth pressure of about 10.0 Torr for about 10 minutes. The fourth reaction gas may include at least one of a nitrogen gas and a nitrogen monoxide gas. When the fourth reaction gas includes both of the nitrogen gas and the nitrogen monoxide gas, a flow rate ratio between the nitrogen gas and the nitrogen monoxide gas may be in a range of about 1.0:0.02 to 0.05. For example, the nitrogen gas and the nitrogen monoxide gas may be provided onto the insulation structure 180 at a flow rate of about 9.8 slm and a flow rate of about 0.2 slm, respectively.

In some example embodiments of the present invention, the oxidation process, the first nitration process and the second nitration process may be carried out in-situ using one process chamber so as to form the insulation structure 180 on the object 150.

As described above, the lower portion of the first preliminary oxide layer 155 may be changed into the lower oxide layer 265 by accumulating the nitrogen atoms at the lower portion of the first preliminary oxide layer 155 in the first nitration process. Hence, generations of charge trapping sites in the second preliminary oxide layer 160 and the lower nitride layer 165 may be primarily prevented. Further, the upper portion of the second preliminary oxide layer 160 may be changed into the upper nitride layer 175 by the second nitration process so that the generations of the charge trapping sites in the insulation structure 180 may be secondarily prevented. Owing the first and the second nitration processes, thinning of a peripheral portion of the insulation structure 180 including edge may be effectively prevented because a stress concentrated at an edge portion of the insulation structure 180 may be reduced.

Figure 14:
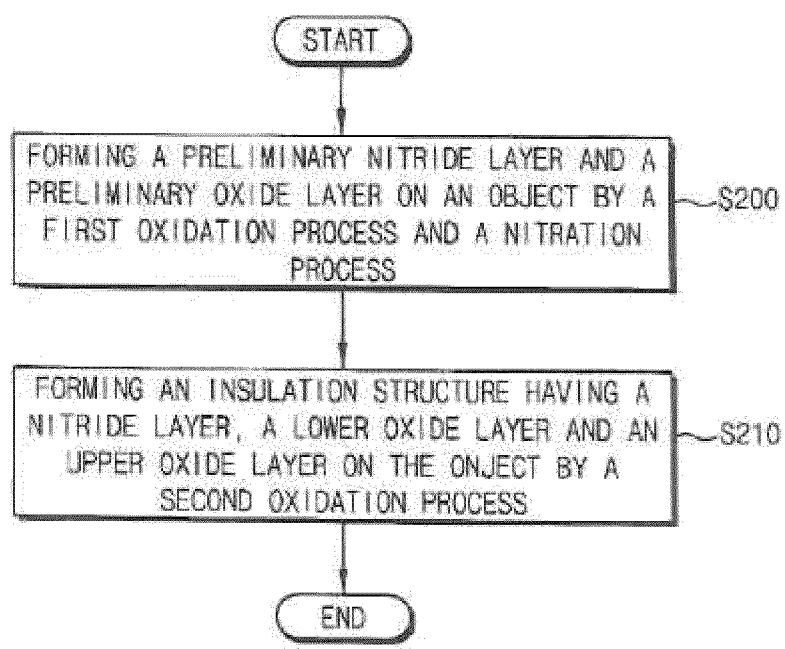
FIG. 14 is a flow chart illustrating a method of forming an insulation structure in accordance with example embodiments of the present invention.
Figure 15:
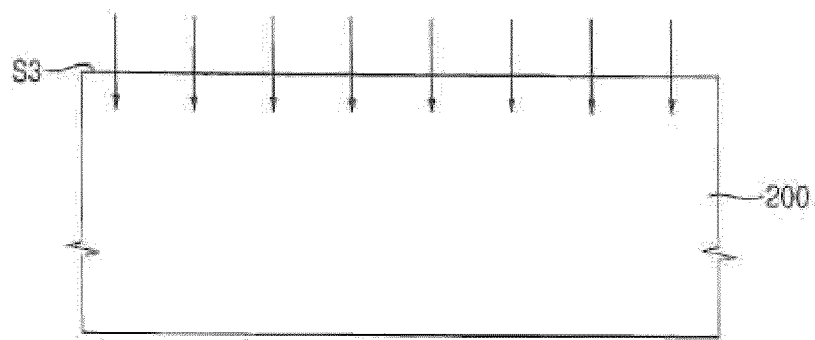
FIGS. 15 to 17 are cross-sectional views illustrating a method of forming an insulation structure in accordance with example embodiments of the present invention.
Figure 16:
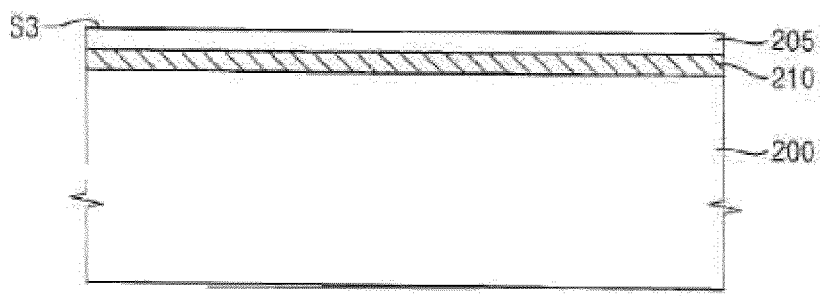
Figure 17:
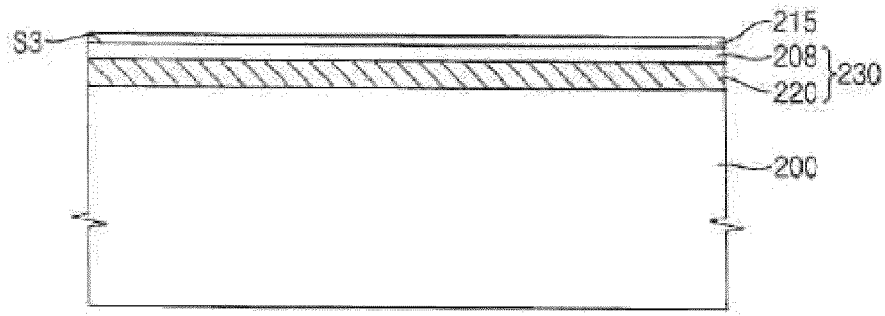

FIG. 14 is a flow chart illustrating a method of forming an insulation structure in accordance with example embodiments of the present invention. FIGS. 15 to 17 are cross-sectional views illustrating a method of forming an insulation structure in accordance with example embodiments of the present invention.

Referring to FIGS. 14, 15 and 16, a preliminary oxide layer 205 and a preliminary nitride layer 210 are formed on an object 200 by simultaneously performing a first oxidation process and a nitration process in step S200. Particularly, a first reaction gas including oxygen and a second reaction gas including nitrogen may be simultaneously provided onto the object 200 to form the preliminary oxide layer 205 and the preliminary nitride layer 210.

In some example embodiments of the present invention, the first oxidation process may include a first dry oxidation process and the nitration process may include a thermal nitration process. In the first dry oxidation process and the thermal nitration process, the first and the second reaction gases may be introduced into a process chamber in which the object 200 is loaded. The process chamber may have a relatively high first temperature of about 800° C. to about 1,000° C. and a relatively high first pressure of about 5.0 Torr to about 15.0 Torr. A flow rate ratio between the first reaction gas and the second reaction gas may be in a range of about 1.0:0.1 to 0.5. For example, a flow rate of the second reaction gas may be about 2.0 slm when a flow rate of the first reaction gas may be about 10.0 slm.

As arrows shown in FIG. 15, oxygen included in the first reaction gas may be reacted with silicon included in the object 200 and nitrogen atoms included in the second reaction gas may be accumulated under an initial surface S3 of the object 200. Thus, the preliminary nitride layer 210 and the preliminary oxide layer 205 are simultaneously formed on the object 200 as shown in FIG. 16. Since the preliminary nitride layer 210 and the preliminary oxide layer 205 are simultaneously formed, the preliminary oxide layer 205 may have a thickness centering the initial surface S3 of the object 200 and the preliminary nitride layer 210 may be positioned beneath the preliminary oxide layer 205.

Referring to FIGS. 14 and 17, an insulation structure 230 including a nitride layer 220, a lower oxide layer 208 and an upper oxide layer 215 is formed on the object 200 by a second oxidation process in step S210.

In one example embodiment of the present invention, the second oxidation process may include a clean oxidation process. In the clean oxidation process, a third reaction gas including an oxygen gas and a hydrogen chloride gas may be introduced into a process chamber where the object 200 is loaded. The process chamber may have a relatively high second temperature of about 800° C. to about 1,000° C. and a relatively low second pressure of about 0.1 to about 0.5 Torr. A flow rate ratio between the oxygen gas and the hydrogen chloride gas may be in a range of about 9.9:0.1. When the third reaction gas includes above about 4.0 percent by weight of the hydrogen chloride gas, the object 200, the preliminary oxide layer 205 and/or the process chamber may be damaged by the third reaction gas. Thus, the third reaction gas may include about 1.0 to about 3.0 percent by weight of the hydrogen chloride gas. According to the clean oxidation process, clean oxide may be generated in accordance with a reaction between the hydrogen chloride gas and the oxygen gas included in the third reaction gas. The clean oxygen may be reacted with silicon included in the preliminary oxide layer 205 such that the upper oxide layer 215 may be formed on the preliminary oxide layer 205. The upper oxide layer 215 may be formed slightly over the preliminary oxide layer 205 and slightly below the preliminary oxide layer 205. In accordance with a formation of the upper oxide layer 215, the preliminary oxide layer 205 is changed into the lower oxide layer 208. The lower oxide layer 208 may have a thickness substantially thinner than that of the preliminary oxide layer 205. The nitride layer 220 may be formed beneath the lower oxide layer 208 by diffusing nitrogen atoms included in the preliminary nitride layer 210 into a portion of the object 200 while forming the upper oxide layer 215. Thus, the nitride layer 220 may have a thickness substantially thicker than that of the preliminary nitride layer 210.

In another example embodiment of the present invention, the second oxidation process may include a second dry oxidation process. In the second dry oxidation process, after a process chamber may be maintained with a relatively high second temperature of about 800° C. to about 1,000° C. and a relatively high second pressure of 5.0 Torr to about 15.0 Torr, a third reaction gas including an oxygen gas only may be provided onto the object 200 loaded in the process chamber. The third reaction gas may be onto the preliminary oxide layer 205 at a flow rate of about 5.0 slm to about 15.0 slm. Oxygen generated by thermally treating the third reaction gas may be reacted with silicon included in the preliminary oxide layer 205 so that the upper oxide layer 215 is formed on the preliminary oxide layer 205 while changing the preliminary oxide layer 205 into the lower oxide layer 208.

In some example embodiments of the present invention, the first oxidation process, the nitration process and the second oxidation process may be performed in-situ using one process chamber in order to form the insulation structure 230 on the object 200.

Figure 18:
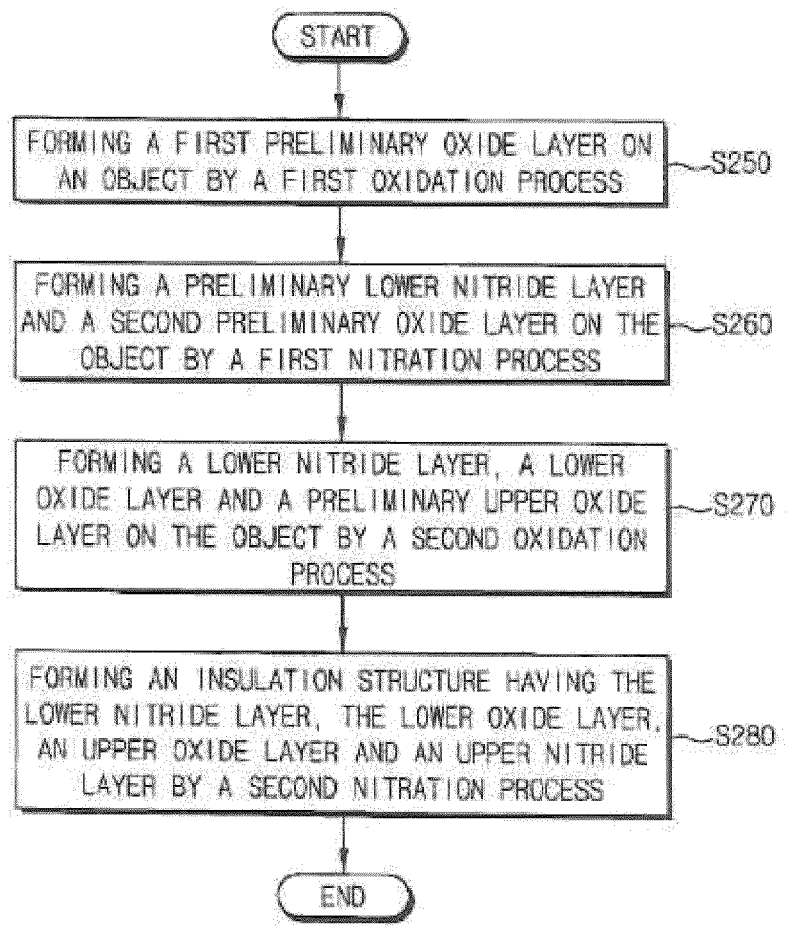
FIG. 18 is a flow chart illustrating a method of forming an insulation structure in accordance with example embodiments of the present invention.

FIG. 18 is a flow chart illustrating a method of forming an insulation structure in accordance with example embodiments of the present invention. FIGS. 19 to 22 are cross-sectional views illustrating a method of forming an insulation structure in accordance with example embodiments of the present invention.

Figure 19:
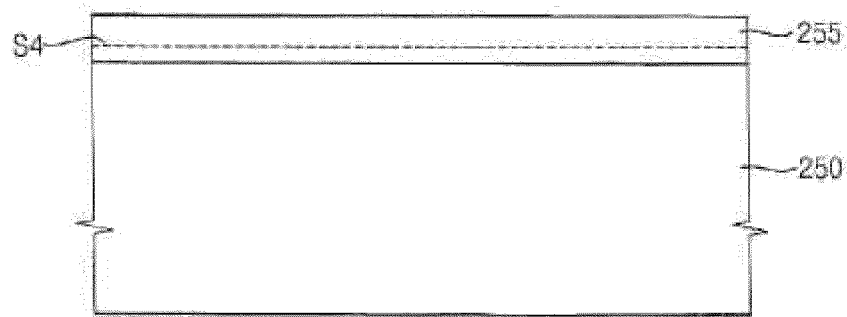
FIGS. 19 to 22 are cross-sectional views illustrating a method of forming an insulation structure in accordance with example embodiments of the present invention.

Referring to FIGS. 18 and 19, a first preliminary oxide layer 255 is formed on an object 250 by a first oxidation process in step S250. A lower structure including a contact region, a pad, an insulation layer, an insulation pattern, a conductive layer, a conductive pattern, a gate structure and/or a transistor may be formed on the object 250. The first oxidation process may include a first radical oxidation process.

In the first radical oxidation process, the object 250 may be loaded into a process chamber having a relatively high first temperature and a relatively low first pressure, and then a first reaction gas including an oxygen gas and a hydrogen gas may be provided onto the object 250. In the process chamber having the relatively high first temperature and the relatively low first pressure, first oxygen radicals may be generated over the object 250 in accordance with a reaction between the hydrogen gas and the oxygen gas included in the first reaction gas. The first oxygen radicals may be reacted with silicon included in the object 250 to form the first preliminary oxide layer 255 on the object 250. Since an upper portion of the object 250 may be reacted with the first oxygen radicals to form the first preliminary oxide layer 255 is formed on the object 250, the first preliminary oxide layer 255 may have a predetermined thickness centering an initial surface S4 of the object 250. The first preliminary oxide layer 255 may be formed over the initial surface S4 of the object 250 and slightly below the initial surface S4 of the object 250.

In some example embodiments of the present invention, the first oxygen radicals may be generated over the object 250 by a direct plasma process or a remote plasma process. Then, the first oxygen radicals may be reacted with silicon included in the object 150 to thereby form the first preliminary oxide layer 255 on the object 250.

After forming the first preliminary oxide layer 255 on the object 250, a first purge process is performed so as to purge the process chamber using a first purge gas including an inactive gas.

Figure 20:
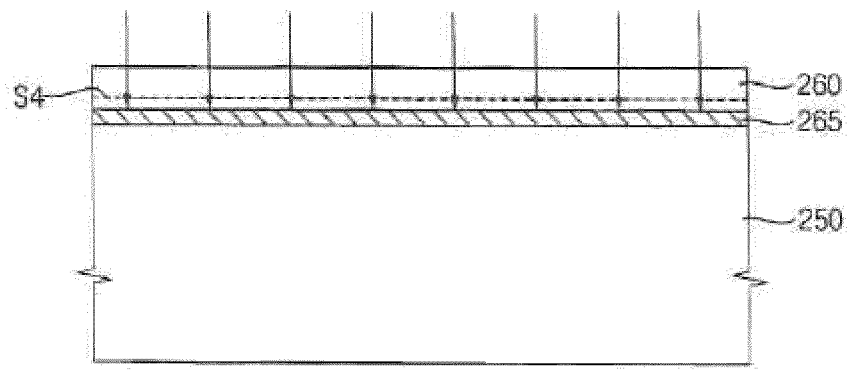

Referring to FIGS. 18 and 20, a preliminary lower nitride layer 265 and a second preliminary oxide layer 260 are formed on the object 250 by a first nitration process in step S260. The first nitration process may include a thermal nitration process.

In the thermal nitration process, a second reaction gas including nitrogen may be introduced into a process chamber having a relatively high second temperature and a relatively high second pressure. The second reaction gas may include a nitrogen monoxide gas, a nitrous oxide gas or an ammonia gas. These can be used alone or in a mixture thereof.

In the above-described first nitration process, nitrogen atoms in the second reaction gas may be accumulated at a lower portion of the first preliminary oxide layer 255 as shown in FIG. 20, so that the preliminary lower nitride layer 265 is formed between the object 250 and the first preliminary oxide layer 255. Particularly, the lower portion of the first preliminary oxide layer 255 may be changed into the preliminary lower nitride layer 265 in accordance with the accumulation of the nitrogen atoms at the lower portion of the first preliminary oxide layer 255. An upper face of the preliminary lower nitride layer 265 may be positioned substantially under the initial surface S4 of the object 250. The second preliminary oxide layer 260 may have a thickness substantially thinner than that of the first preliminary oxide layer 255 by a thickness of the preliminary lower nitride layer 265.

After forming the second preliminary oxide layer 260 and the preliminary lower nitride layer 265, a second purge process is performed so as to purge the process chamber using a second purge gas that includes an inactive gas such as an argon gas, a nitrogen gas, a helium gas and/or a nitrogen gas.

Figure 21:
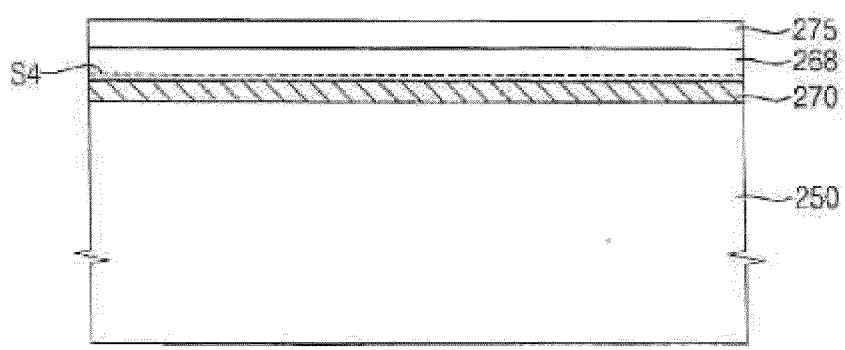

Referring to FIGS. 18 and 21, a second oxidation process is executed to form a lower nitride layer 270, a lower oxide layer 268 and a preliminary upper oxide layer 275 on the object 250 in step S270. In the second oxidation process, nitrogen atoms included in the preliminary lower nitride layer 265 may be diffused into portions of the object 250 and the second preliminary oxide layer 260 so that the lower nitride layer 270 may be obtained. The lower nitride layer 270 may have a thickness substantially thicker than that of the preliminary lower oxide layer 265. Further, silicon included in the second preliminary oxide layer 260 may be reacted with second oxygen radicals or oxygen such that the preliminary upper oxide layer 275 may be formed on the second preliminary oxide layer 260. The preliminary upper oxide layer 275 may be formed slightly over a surface of the second preliminary oxide layer 265 and under the surface of the second preliminary oxide layer 265. Thus, the second preliminary oxide layer 265 may be changed into the lower oxide layer 268 having a thickness substantially thinner than that of the second preliminary oxide layer 265. The preliminary upper oxide layer 275 may grow from the lower oxide layer 268 and may have a thickness substantially thinner than that of the lower oxide layer 268.

In one example embodiment of the present invention, the second oxidation process may include a second radical oxidation process. In the second radical oxidation process, a third reaction gas including an oxygen gas and a hydrogen gas may be introduced into a process chamber in which the object 250 is loaded. The process chamber may have a relatively high third temperature of about 800° C. to about 1,000° C. and a relatively low third pressure of about 0.1 Torr to about 0.5 Torr. The second oxygen radicals generated by a reaction between the hydrogen gas and the oxygen gas may be reacted with silicon included in the second preliminary oxide layer 265. Hence, the second preliminary oxide layer 265 may be converted into the lower oxide layer 268, and also the preliminary upper oxide layer 275 may be formed on the lower oxide layer 268. Further, the nitrogen atoms included in the preliminary lower nitride layer 265 may be diffused into the portions of the object 250 and the second preliminary oxide layer 260 to thereby form the lower nitride layer 270 on the object 250. The lower nitride layer 270 may have a thickness substantially thicker than that of the preliminary nitride layer 265. In some example embodiments, the second oxygen radicals may be formed by a direct plasma process or a remote plasma process.

In another example embodiment of the present invention, the second oxidation process may include a clean oxidation process. In the clean oxidation process, a third reaction gas including an oxygen gas and a hydrogen chloride gas may be introduced into a process chamber having a relatively high third temperature of about 800° C. to about 1,000° C. and a relatively low third pressure of about 0.1 Torr to about 0.5 Torr. A flow rate ratio between the oxygen gas and the hydrogen chloride gas may be in a range of about 9.9:0.1. The third reaction gas may include about 1.0 to about 3.0 percent by weight of the hydrogen chloride gas. Clean oxide may be generated by a reaction between the hydrogen chloride gas and the oxygen gas included in the third reaction gas, and the clean oxygen may be reacted with silicon included in the second preliminary oxide layer 260. Hence, the second preliminary oxide layer 260 may be changed into the lower oxide layer 268 and the preliminary upper oxide layer 275 may be formed on the lower oxide layer 268.

In still another example embodiment of the present invention, the second oxidation process may include a dry oxidation process. In the dry oxidation process, a third reaction gas including oxygen may be introduced into a process chamber having a relatively high third temperature of about 800° C. to about 1,000° C. and a relatively high third pressure of about 5.0 Torr to about 10.0 Torr. The third reaction gas may be introduced into the process chamber at a flow rate of about 5.0 slm to about 15.0 slm. After generating oxygen by thermally treating the third reaction gas, oxygen may be reacted with silicon included in the second preliminary oxide layer 260. Thus, the second preliminary oxide layer 260 may be changed into the lower oxide layer 268 and the preliminary upper oxide layer 275 may be formed on the lower oxide layer 268.

After formations of the lower nitride layer 270, the lower oxide layer 268 and the preliminary upper oxide layer 275, a third purge process is carried out so as to purge the process chamber using a third purge gas. The third purge gas may include an inactive gas substantially the same as that of the first purge gas and/or that of the second purge gas.

Figure 22:
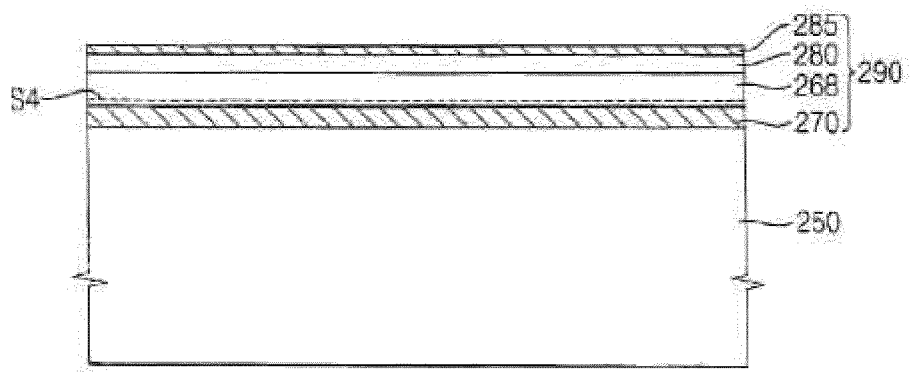

Referring to FIGS. 18 and 22, a second nitration process is performed to form an insulation structure 290 including the lower nitride layer 270, the lower oxide layer 268, an upper oxide layer 280 and an upper nitride layer 285 in step S280. The second nitration process may include a plasma nitration process.

In the plasma nitration process, a fourth reaction gas including nitrogen may be introduced into a process chamber where the object 250 is loaded, and then a power of about 1,000 W to about 2,000 W may be applied to the fourth reaction gas so as to generate a nitrogen plasma over the object 250. The nitrogen plasma may be reacted with the preliminary upper oxide layer 275 so that the preliminary upper oxide layer 275 may be changed into the upper oxide layer 280 and the upper nitride layer 285 may be formed on the upper oxide layer 280. Since an upper potion of the preliminary upper oxide layer 275 may be converted into the upper nitride layer 285, the upper oxide layer 280 may have a thickness substantially thinner than that of the preliminary upper oxide layer 275 by a thickness of the upper nitride layer 285.

In the second nitration process, the process chamber may have a relatively low fourth temperature and a relatively high a fourth pressure. For example, the relatively high fourth temperature may be in a range of about 400° C. to about 800° C. and the relatively high fourth pressure may be in a range of about 0.5 Torr to about 1.5 Torr. The fourth reaction gas may be provided onto the object 250 for about 1 minute to about 3 minutes. In an example embodiment, the fourth reaction gas may be introduced into the process chamber together with a carrier gas. A flow rate ratio between the fourth reaction gas and the carrier gas may be in a range of about 1.0:10.0 to 15.0. The fourth reaction gas may include a nitrogen gas or an ammonia gas. These can be used alone or in a mixture thereof.

In some example embodiments of the present invention, a post thermal treatment process may be performed about the insulation structure 290 formed on the object 250. The post thermal treatment process may be carried out using a fifth reaction gas to dense the upper nitride layer 285 and to uniformly distribute nitrogen atoms in the upper nitride layer 285. The post thermal treatment process may be executed at a relatively high fifth temperature of about 800° C. to about 1,000° C. and a relatively high fifth pressure of about 5.0 Torr to about 15.0 Torr for about 5 minutes to about 15 minutes. The fifth reaction gas may include a nitrogen gas or a nitrogen monoxide gas. These can be used alone or in a mixture thereof. When the fifth reaction gas includes the nitrogen gas and the nitrogen monoxide gas, a flow rate ratio between the nitrogen gas and the nitrogen monoxide gas may be in a range of about 1.0:0.02 to 0.05.

In some example embodiments of the present invention, the first oxidation process, the first nitration process, the second oxidation process and the second nitration process may be performed in-situ in order to reduce a time for forming the insulation structure 290 including the lower nitride layer 270, the lower oxide layer 268, the upper oxide layer 280 and the upper nitride layer 285.

Figure 23:
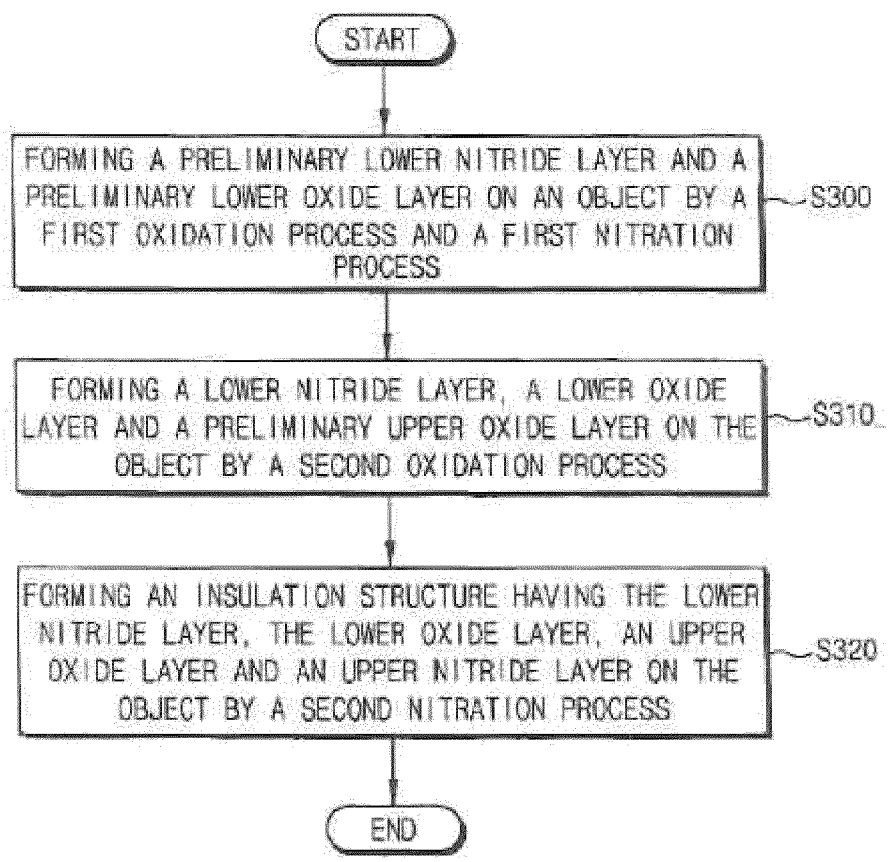
FIG. 23 is a flow chart illustrating a method of forming an insulation structure in accordance with example embodiments of the present invention.

FIG. 23 is a flow chart illustrating a method of forming an insulation structure in accordance with example embodiments of the present invention. FIGS. 24 to 27 are cross-sectional views illustrating a method of forming an insulation structure in accordance with example embodiments of the present invention.

Figure 24:
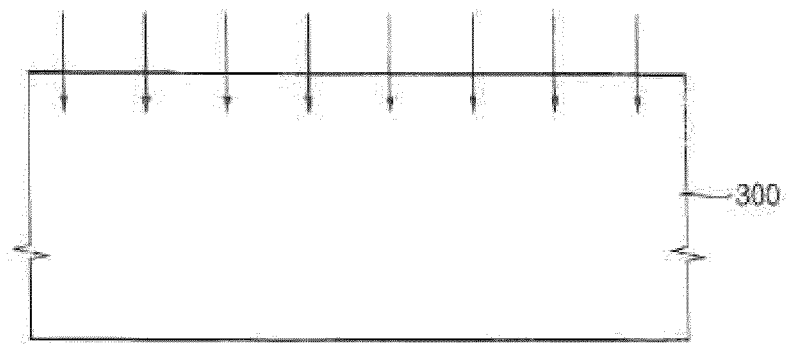
FIGS. 24 to 27 are cross-sectional views illustrating a method of forming an insulation structure in accordance with example embodiments of the present invention.
Figure 25:
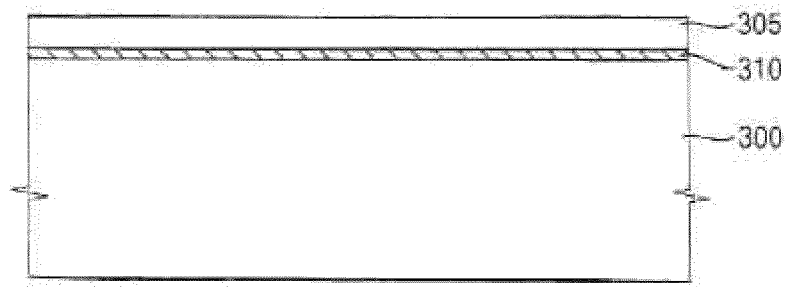

Referring to FIGS. 23, 24 and 25, a preliminary lower oxide layer 305 and a preliminary lower nitride layer 310 are simultaneously formed on an object 300 by performing a first oxidation process and a nitration process in step S300. That is, a first reaction gas including oxygen and a second reaction gas including nitrogen may be simultaneously provided onto the object 300 so as to form the preliminary lower oxide layer 305 and the preliminary lower nitride layer 310 on the object 300.

In some example embodiments of the present invention, the first oxidation process may include a first dry oxidation process and the nitration process may include a thermal nitration process. In the first dry oxidation process and the thermal nitration process, the first and the second reaction gases may be introduced into a process chamber having a relatively high first temperature of about 800° C. to about 1,000° C. and a relatively high first pressure of about 5.0 Torr to about 15.0 Torr. A flow rate ratio between the first reaction gas and the second reaction gas may be in a range of about 1.0:0.1 to 0.5. As arrows shown in FIG. 24, oxygen included in the first reaction gas may be reacted with silicon included in the object 300 and nitrogen atoms included in the second reaction gas may be accumulated under an initial surface of the object 300. Therefore, the preliminary lower nitride layer 310 and the preliminary lower oxide layer 305 may be simultaneously formed on the object 300 as shown in FIG. 25. As the preliminary nitride layer 310 and the preliminary lower oxide layer 305 may be simultaneously formed, the preliminary lower oxide layer 305 may have a thickness centering the initial surface of the object 300 and the preliminary lower nitride layer 310 may be positioned beneath the preliminary lower oxide layer 305.

Figure 26:
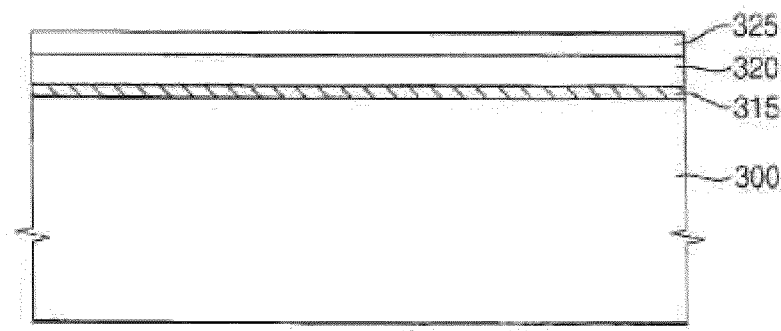

Referring to FIGS. 23 and 26, a second oxidation process is executed to form a lower nitride layer 315, a lower oxide layer 320 and a preliminary upper oxide layer 325 in step S310.

In one example embodiment of the present invention, the second oxidation process may include a clean oxidation process. In the clean oxidation process, a third reaction gas including an oxygen gas and a hydrogen chloride gas may be introduced into a process chamber having a relatively high third temperature of about 800° C. to about 1,000° C. and a relatively low third pressure of about 0.1 Torr to about 0.5 Torr. When the third reaction gas includes above about 4.0 percent by weight of the hydrogen chloride gas, the object 300, the preliminary lower oxide layer 305 and/or the process chamber may be damaged by the third reaction gas. Thus, the third reaction gas may include about 1.0 to about 3.0 percent by weight of the hydrogen chloride gas. In the clean oxidation process, clean oxide may be generated by a reaction between the hydrogen chloride gas and the oxygen gas in the third reaction gas, and then the clean oxygen may be reacted with silicon included in the preliminary lower oxide layer 305 so that the preliminary lower oxide layer 305 may be changed into the lower oxide layer 320, and also the preliminary upper oxide layer 325 may be formed on the lower oxide layer 320. The preliminary upper oxide layer 325 may be formed centering a surface of the preliminary lower oxide layer 305. Since the preliminary upper oxide layer 325 may be formed from the preliminary oxide layer 305, the preliminary upper oxide layer 325 may have a thickness substantially thinner than that of the lower oxide layer 320. In a formation of the preliminary upper oxide layer 325, nitrogen atoms included in the preliminary lower nitride layer 310 may be diffused into a portion of the object 300. Hence, the lower nitride layer 315 may be formed between the object 300 and the lower oxide layer 320. The lower nitride layer 315 may have a thickness substantially thicker than that of the preliminary lower nitride layer 310.

In another example embodiment of the present invention, the second oxidation process may include a second dry oxidation process. In the second dry oxidation process, a third reaction gas including oxygen may be introduced into a process chamber having a relatively high second temperature of about 800° C. to about 1,000° C. and a relatively high second pressure of about 5.0 Torr to about 10.0 Torr. The third reaction gas may be introduced into the process chamber at a flow rate of about 5.0 slm to about 15.0 slm. Oxygen generated by thermally treating the third reaction gas may be reacted with silicon included in the preliminary lower oxide layer 305 such that the preliminary lower oxide layer 305 may be changed into the lower oxide layer 320 and the preliminary upper oxide layer 325 may be simultaneously formed on the lower oxide layer 320.

Figure 27:
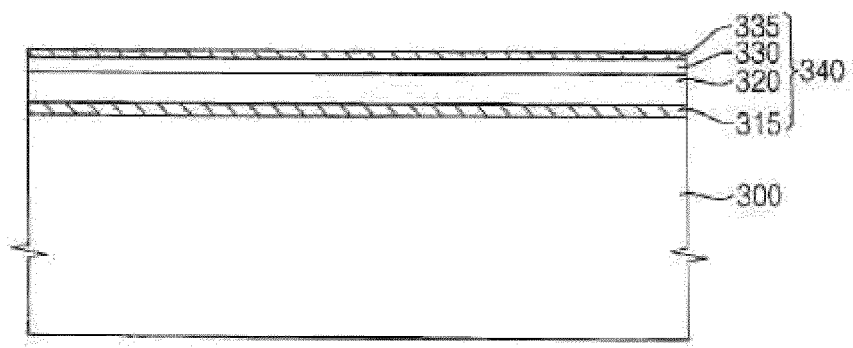

Referring to FIGS. 23 and 27, a second nitration process is carried out to form an insulation structure 340 on the object 300 in step S320. The insulation structure 340 includes the lower nitride layer 315, the lower oxide layer 320, an upper oxide layer 325 and an upper nitride layer 335. The second nitration process may include a plasma nitration process.

In the plasma nitration process, after a fourth reaction gas including nitrogen may be introduced into a process chamber in which the object 300 is loaded, a power of about 1,000 W to about 2,000 W may be applied to the fourth reaction gas in order to generate a nitrogen plasma over the object 300. The nitrogen plasma may be reacted with the preliminary upper oxide layer 325 such that the preliminary upper oxide layer 35 may be changed into the upper oxide layer 330 and the upper nitride layer 335 may be simultaneously formed on the upper oxide layer 330. As an upper potion of the preliminary upper oxide layer 325 may be converted into the upper nitride layer 335, the upper oxide layer 330 may have a thickness substantially thinner than that of the preliminary upper oxide layer 325 by a thickness of the upper nitride layer 335. In the second nitration process, the process chamber may have a relatively low third temperature of about 400° C. to about 800° C. and a relatively high third pressure of about 0.5 Torr to about 1.5 Torr. The fourth reaction gas may be provided onto the preliminary upper oxide layer 325 for about 1 minute to about 3 minutes. In an example embodiment, the fourth reaction gas may be introduced into the process chamber together with a carrier gas. A flow rate ratio between the fourth reaction gas and the carrier gas may be in a range of about 1.0:10.0 to 15.0. The fourth reaction gas may include a nitrogen gas and/or an ammonia gas.

In some example embodiments of the present invention, a post thermal treatment process may be executed about the insulation structure 340 on the object 300. The post thermal treatment process may be performed using a fifth reaction gas including nitrogen so as to dense the upper nitride layer 335 and to uniformly distribute nitrogen atoms in the upper nitride layer 335. The post thermal treatment process may be carried out at a relatively high fourth temperature of about 800° C. to about 1,000° C. and a relatively high fourth pressure of about 5.0 Torr to about 15.0 Torr for about 5 minutes to about 15 minutes. The fifth reaction gas may include a nitrogen gas and/or a nitrogen monoxide gas.

In some example embodiments of the present invention, the first oxidation process, the first nitration process, the second oxidation process and the second nitration process may be carried out in-situ to reduce a time for forming the insulation structure 340 including the lower nitride layer 315, the lower oxide layer 320, the upper oxide layer 330 and the upper nitride layer 335.

Figure 28:
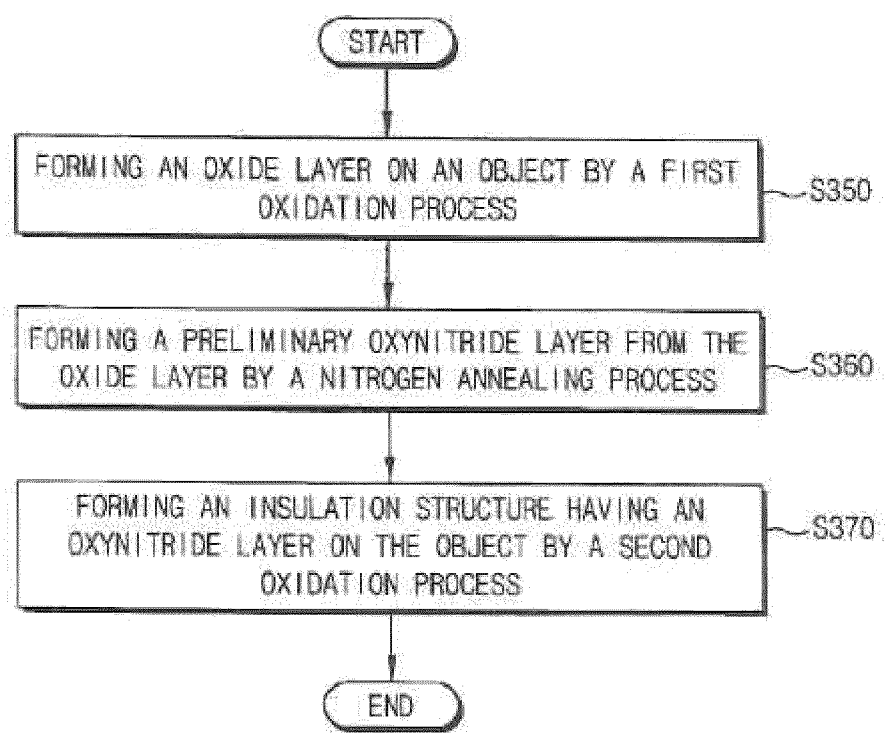
FIG. 28 is a flow chart illustrating a method of forming an insulation structure in accordance with example embodiments of the present invention.
Figure 29:
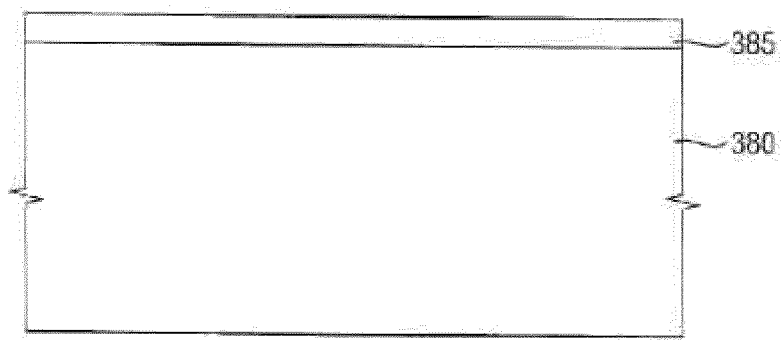
FIGS. 29 to 31 are cross-sectional views illustrating a method of forming an insulation structure in accordance with example embodiments of the present invention.
Figure 30:
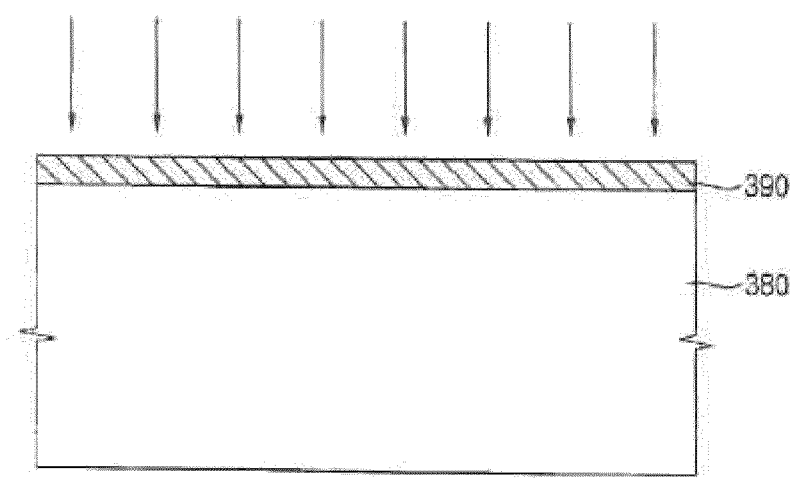
Figure 31:
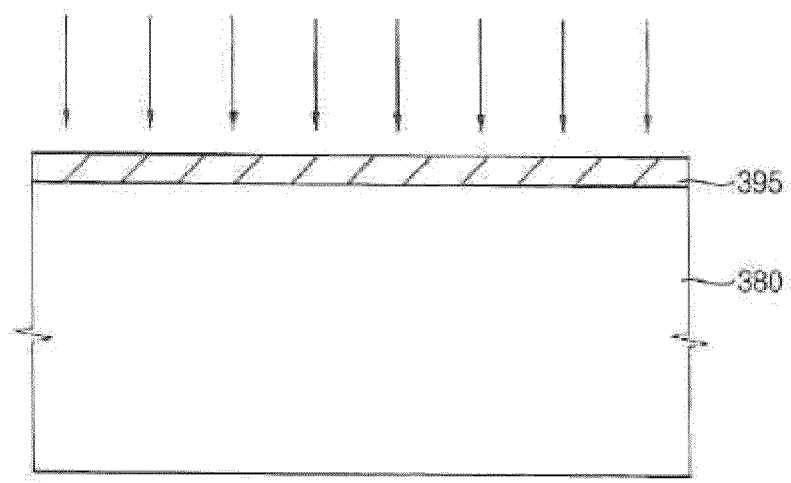

FIG. 28 is a flow chart illustrating a method of forming an insulation structure in accordance with example embodiments of the present invention. FIGS. 29 to 31 are cross-sectional views illustrating a method of forming an insulation structure in accordance with example embodiments of the present invention.

Referring to FIGS. 28 and 29, a first oxidation process is carried out to form an oxide layer 385 on an object 380 in step S350. The object 380 may include a semiconductor substrate such as a silicon substrate, a germanium substrate, silicon germanium substrate, an SOI substrate, etc. Alternatively, the object 380 may include a metal oxide substrate such as an aluminum oxide substrate, a strontium ruthenium oxide substrate, etc. As described above, a lower structure may be provided on the object 380. The lower structure may include a contact region, a pad, an insulation layer, an insulation pattern, a conductive layer, a conductive pattern, a gate structure and/or a transistor. When the object 380 includes silicon, the oxide layer 385 may include silicon oxide because the oxide layer 385 may be formed by the first oxidation process. The first oxidation process may include a radical oxidation process.

According to some example embodiments of the present invention, after the object 380 may be loaded into a process chamber, a first reaction gas including a hydrogen gas and an oxygen gas may be provided onto the object 380 in the radical oxidation process. The process chamber may have a relatively high first temperature of about 800° C. to about 1,000° C. and a relatively low first pressure of about 0.1 Torr to about 0.5 Torr. In an example embodiment, the first oxidation process may be performed at the relatively high first temperature of about 900° C. and the relatively low first pressure of about 0.3 Torr. In the process chamber having the relatively high first temperature and the relatively low first pressure, oxygen radicals may be generated over the object 380 in accordance with a reaction between the hydrogen gas and the oxygen gas included in the first reaction gas. For example, the first reaction gas may be thermally treated at the relatively high first temperature and the relatively low first pressure to thereby generate the oxygen radicals in the process chamber. The hydrogen gas may be introduced into the process chamber at a flow rate of about 2.0 slm to about 3.0 slm, and the oxygen gas may be provided into the process chamber by about 0.1 slm to about 0.5 slm. A flow rate ratio between the hydrogen gas and the oxygen gas may be in a range of about 1.0:4.0 to 30.0. The first reaction gas including the hydrogen and the oxygen gases may be provided onto the object 380 for about 10 minutes to about 30 minutes. In an example embodiment, the first reaction gas may be introduced into the process chamber for about 20 minutes.

The oxygen radicals may be reacted with silicon included in the object 380 to form the oxide layer 385 including silicon oxide on the object 380. That is, an upper portion of the object 380 including silicon may be reacted with the oxygen radicals such that the oxide layer 385 may be formed on the object 380. Thus, the oxide layer 385 may have a predetermined thickness centering an initial surface of the object 380. Particularly, the oxide layer 385 may be formed slightly over the initial surface of the object 380 and slightly below the initial surface of the object 380. In some example embodiments, the oxygen radicals may be generated over the object 380 by a direct plasma process or a remote plasma process, and then the oxygen radicals may be reacted with silicon included in the object 380 to form the oxide layer 385 on the object 380.

After forming the oxide layer 385, a first purge process is performed so as to purge the process chamber. The process chamber may be purged using a first purge gas that includes an inactive gas such as an argon gas, a nitrogen gas or a helium gas. These can be used alone or in a mixture thereof. The first purge gas may be introduced into the process chamber for about 1 minute to about 3 minutes at a flow rate of about 0.5 slm to about 4.5 slm. For example, the first purge gas including the nitrogen gas may be introduced into the process chamber for about 2 minutes.

Referring to FIGS. 28 and 30, a preliminary oxynitride layer 390 is formed on the object 380 by a nitrogen annealing process in step S360. The nitrogen annealing process may be carried out under an atmosphere including nitrogen.

In the nitrogen annealing process, a second reaction gas including nitrogen may be provided onto the object 380 loaded in a process chamber while the process chamber may have a relatively high second temperature and a relatively high second pressure. The relatively high second temperature may be in a range of about 800° C. to about 1,000° C. and the relatively high second pressure may be in a range of about 5.0 Torr to about 15.0 Torr. In an example embodiment, the preliminary oxynitride layer 390 may be formed at the relatively high second temperature of about 900° C. and the relatively high second pressure of about 10.0 Torr. The second reaction gas including nitrogen may be introduced into the process chamber for about 5 minutes to about 20 minutes. For example, the second reaction gas may be provided onto the object 380 for about 10 minutes.

In one example embodiment of the present invention, the second reaction gas including nitrogen may include a nitrogen monoxide gas. For example, the second reaction gas including the nitrogen monoxide gas may be provided onto the oxide layer 385 for about 5 minutes to about 20 minutes at a flow rate of about 0.5 slm to about 1.5 slm. For example, the second reaction gas may be introduced into the process chamber for about 10 minutes at a flow rate of about 10 minutes. In another example embodiment of the present invention, the second reaction gas including nitrogen may include a nitrous oxide gas. In still another example embodiment of the present invention, the second reaction gas including nitrogen may include an ammonia gas. In still another example embodiment of the present invention, the second reaction gas including nitrogen may include a nitrogen gas. In other example embodiments of the present invention, the second reaction gas including nitrogen may include at least two of the nitrogen monoxide gas, the nitrous oxide gas, the ammonia gas and the nitrogen gas. For example, the second reaction gas including nitrogen may include the nitrogen monoxide gas and the nitrogen gas, or the nitrogen monoxide gas and the ammonia gas. Alternatively, the second reaction gas including nitrogen may include the nitrogen monoxide gas, the nitrogen gas and the nitrous oxide gas. When the second reaction gas including nitrogen includes the nitrogen monoxide gas and the nitrogen gas, the nitrogen monoxide gas and the nitrogen gas may be provided onto the oxide layer 385 at a flow rate of about 0.3 slm to about 1.0 slm and a flow rate of about 0.5 slm to about 4.0 slm, respectively. Hence, a flow rate ratio between the nitrogen monoxide gas and the nitrogen gas may be in a range of about 1.0:0.5 to about 13.5.

In the above-described nitrogen annealing process, nitrogen atoms in the second reaction gas including nitrogen may be accumulated in the oxide layer 385 as shown in FIG. 30. Thus, the preliminary oxynitride layer 390 may be formed on the object 380. When the oxide layer 385 includes silicon oxide, the preliminary oxynitride layer 390 includes silicon oxynitride. The oxide layer 385 may be fully changed into the preliminary oxynitride layer 390 in accordance with the accumulation of the nitrogen atoms in the oxide layer 385. As the preliminary oxynitride layer 390 may be formed from the oxide layer 385, the oxide layer 385 is fully changed into the preliminary oxynitride layer 390. The preliminary oxynitride layer 390 may have an upper face substantially higher than the initial surface of the object 300. The preliminary oxynitride layer 390 may have a thickness substantially the same as that of the oxide layer 385. The second reaction gas including nitrogen may remove dangling bonds in the oxide layer 385. Additionally, the nitrogen atoms included in the second reaction gas including nitrogen may substitute bonds of silicon-nitrogen for bonds of silicon-oxygen and silicon-hydrogen in the oxide layer 385. Therefore, charge trapping sites may be effectively removed from the preliminary oxynitride layer 390.

After forming the preliminary oxynitride layer 390 on the object 380, a second purge process is performed to purge the process chamber using a second purge gas. The second purge gas may include an inactive gas including an argon gas, a nitrogen gas, a helium gas or a nitrogen gas. These can be used alone or in a mixture thereof. The second purge gas may be introduced into the process chamber for at 1.0 minute to about 3.0 minutes at a flow rate of about 0.5 slm to about 4.5 slm. For example, the second reaction gas including the nitrogen gas may be introduced into the process chamber for about 2 minutes.

Referring to FIGS. 28 and 31, the insulation structure including an oxynitride layer 395 may be formed on the object 380 by a second oxidation process in step S370.

In one example embodiment of the present invention, the second oxidation process may be carried out using an oxygen gas and a hydrogen chloride gas. In the second oxidation process, charge trapping sites generated in the insulation structure may be effectively removed because chlorine included in the third reaction gas may substitute for hydrogen remaining in the preliminary oxynitride layer. A bonding energy of silicon-hydrogen is about 3.1 eV and a bonding energy of silicon-chlorine is about 4.21 eV. When the insulation structure includes bonds of silicon-hydrogen, the charge trapping sites may be generated in the insulation structure due to hydrogen released in the insulation structure while accumulating charges into the insulation structure or erasing the charges from the insulation structure. When chlorine may substitute for hydrogen in the insulation structure, however, generations of the charge trapping sites in the insulation layer may be effectively prevented because the bonding energy of silicon-chlorine is higher than the bonding energy of silicon-hydrogen.

In another example embodiment of the present invention, the second oxidation process may include a clean oxidation process. In the clean oxidation process, a third reaction gas including an oxygen gas and a hydrogen chloride gas may be introduced into a process chamber where the object 380 is loaded. The process chamber may have a relatively high third temperature of about 800° C. to about 1,000° C. and a relatively low third pressure of about 0.1 Torr to about 0.5 Torr. A flow rate ratio between the oxygen gas and the hydrogen chloride gas may be in a range of about 9.9:0.1. When the third reaction gas includes above about 4.0 percent by weight of the hydrogen chlorine gas, the object 380, the preliminary oxynitride layer 390 and/or the process chamber may be damaged. Hence, the third reaction gas may include about 1.0 to about 3.0 percent by weight of the hydrogen chloride gas.

In some example embodiments of the present invention, the first oxidation process, the nitrogen annealing process and the second oxidation process may be carried out in-situ so as to reduce a process time for forming the insulation structure including the oxynitride layer 395.

Figure 32:
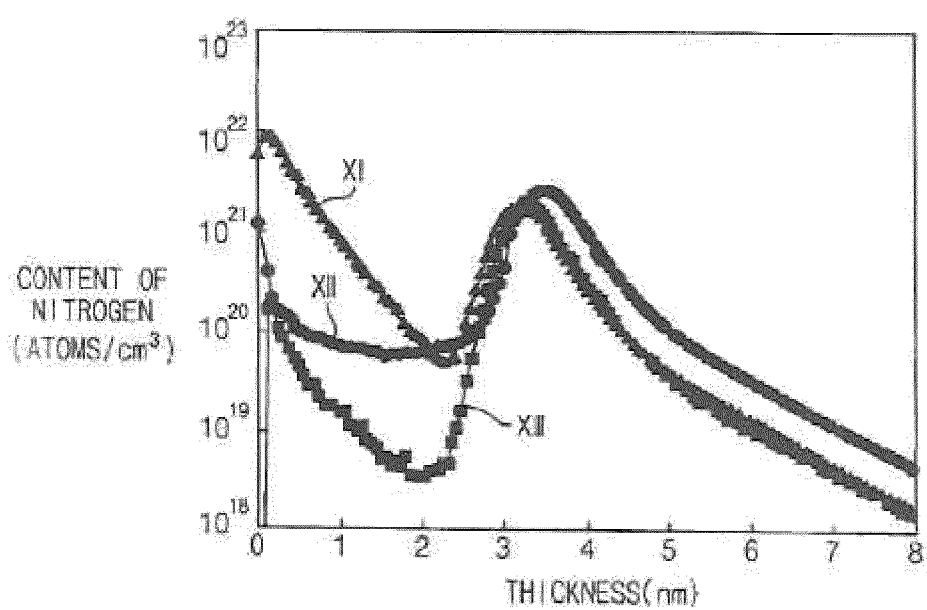
FIG. 32 is a graph illustrating nitrogen contents in insulation structures relative to thicknesses of the insulation structures in accordance with example embodiments of the present invention.

FIG. 32 is a graph illustrating nitrogen contents in insulation structures relative to thicknesses of the insulation structures in accordance with example embodiments of the present invention. In FIG. 32 "XI" indicates a nitrogen content in an insulation structure relative to a thickness of the insulation structure formed by a radical oxidation process and a thermal nitration process, and "XII" represents a nitrogen content in an insulation structure relative to a thickness of the insulation structure formed by a radical oxidation process and a thermal nitration process. Further, "XIII" denotes a nitrogen content in an insulation structure relative to a thickness of the insulation structure formed by a radical oxidation process and a plasma nitration process.

As shown in FIG. 32, nitrogen atoms may not be uniformly distributed into lower portions of the insulation structures XI and XIII when the insulation structures XI and XIII are formed by the thermal and the plasma nitration processes. That is, the insulation structures XI and XIII are formed by the thermal and the plasma nitration processes may not have uniform nitrogen contents. However, nitrogen atoms may be uniformly distributed from an upper portion of the insulation structure XII to a lower portion of the insulation structure XII when the insulation structure XII is obtained by the nitrogen annealing process. Since the insulation structure XII formed by the radical oxidation and the nitrogen annealing processes may have a uniform nitrogen content, the insulation structure XII may be advantageously used as a tunnel insulation layer or a gate insulation layer in a semiconductor device.

Figure 33:
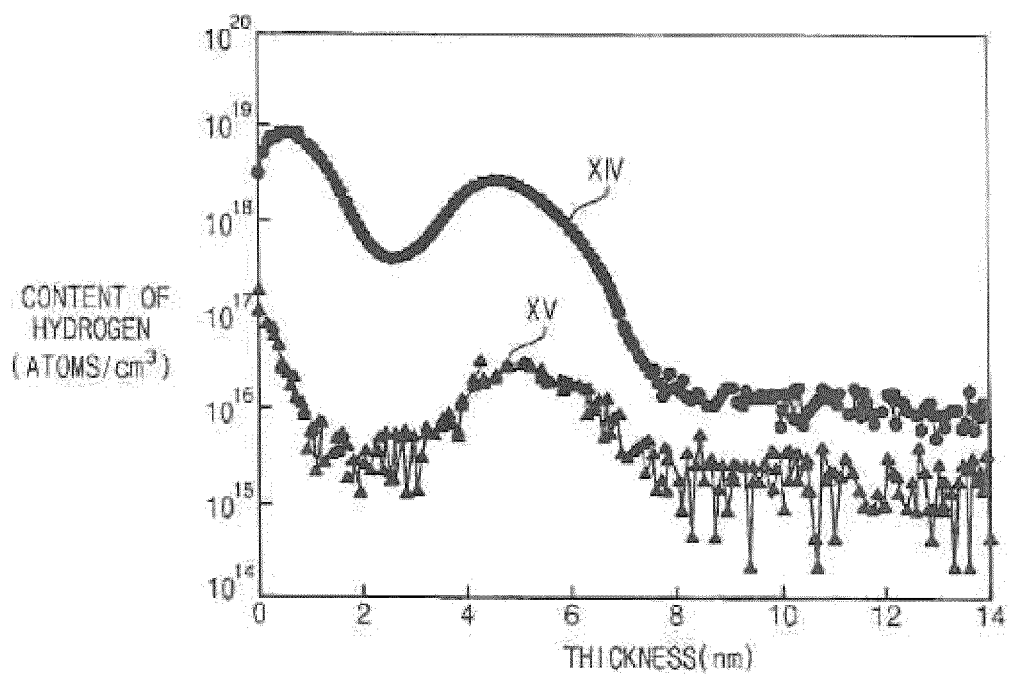
FIG. 33 is a graph illustrating hydrogen contents in insulation structures relative to thicknesses of the insulation structures in accordance with example embodiments of the present invention.
Figure 34:
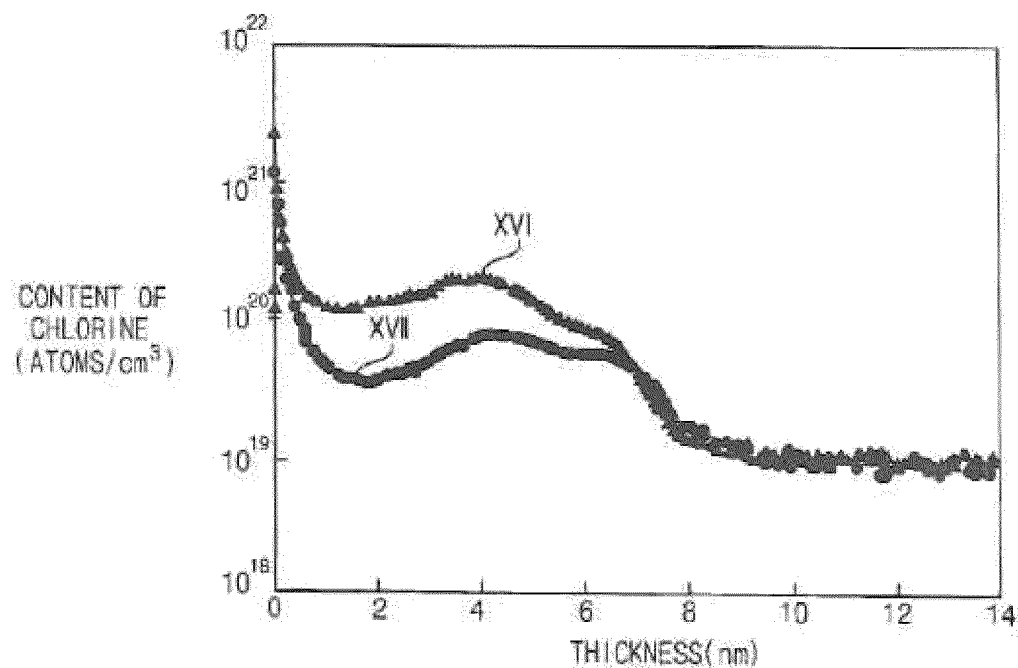
FIG. 34 is a graph illustrating chlorine contents in insulation structures relative to thicknesses of the insulation structures in accordance with example embodiments of the present invention.

FIG. 33 is a graph illustrating hydrogen contents in insulation structures relative to thicknesses of the insulation structures in accordance with example embodiments of the present invention. FIG. 34 is a graph illustrating chlorine contents in insulation structures relative to thicknesses of the insulation structures in accordance with example embodiments of the present invention. In FIG. 33, "XIV" means a hydrogen content in an insulation structure relative to a thickness of the insulation structure formed by a radical oxidation process, a nitrogen annealing process and an oxidation process performed using an oxygen gas only. Additionally, "XV" indicates a hydrogen content in an insulation structure relative to a thickness of the insulation structure formed by a radical oxidation process, a nitrogen annealing process and an oxidation process performed using an oxygen gas and a hydrogen chloride gas. In FIG. 34, "XVI" represents a chlorine content in an insulation structure relative to a thickness of the insulation structure formed by a radical oxidation process, a nitrogen annealing process and an oxidation process performed using an oxygen gas and a hydrogen chloride gas. Further, "XVII" means a chlorine content in an insulation structure relative to a thickness of the insulation structure formed by radical oxidation process, a nitrogen annealing process and an oxidation process performed using an oxygen gas only.

Referring to FIGS. 33 and 34, the hydrogen content of the insulation structure XV formed by the oxidation process using the oxygen and the hydrogen chloride gases may be considerably smaller than that of the insulation structure XIV obtained by the oxidation process using the oxygen gas only. Additionally, the chlorine content of the insulation structure XVI obtained by the oxidation process using the oxygen and the hydrogen chloride gases may be substantially larger than that of the insulation structure XVII obtained by the oxidation process using the oxygen gas only. When the insulation structures XV and XVI are formed by the oxidation processes using the oxygen and the hydrogen chloride gases, chlorine may substitute for hydrogen in the insulation structures XV and XVI so that hydrogen may be effectively removed from the insulation structures XV and XVI. As described above, the bonding energy of silicon-chlorine is substantially higher than the bonding energy of silicon-hydrogen. When the insulation structure mainly includes the bonds of silicon-hydrogen, hydrogen may be released in the insulation structure during a programming operation or an erasing operation so that charge trapping sites may be generated in the insulation structure. When chlorine substitutes for hydrogen in the insulation structure, generations of the charge trapping sites in the insulation structure may be effectively prevented because the bonding energy of silicon-chlorine is relatively large. Therefore, a semiconductor device may have an enhanced reliability and an improved endurance when the insulation structures XV and XVI are employed as a tunnel insulation layer or a gate insulation layer of the semiconductor device.

Figure 35:
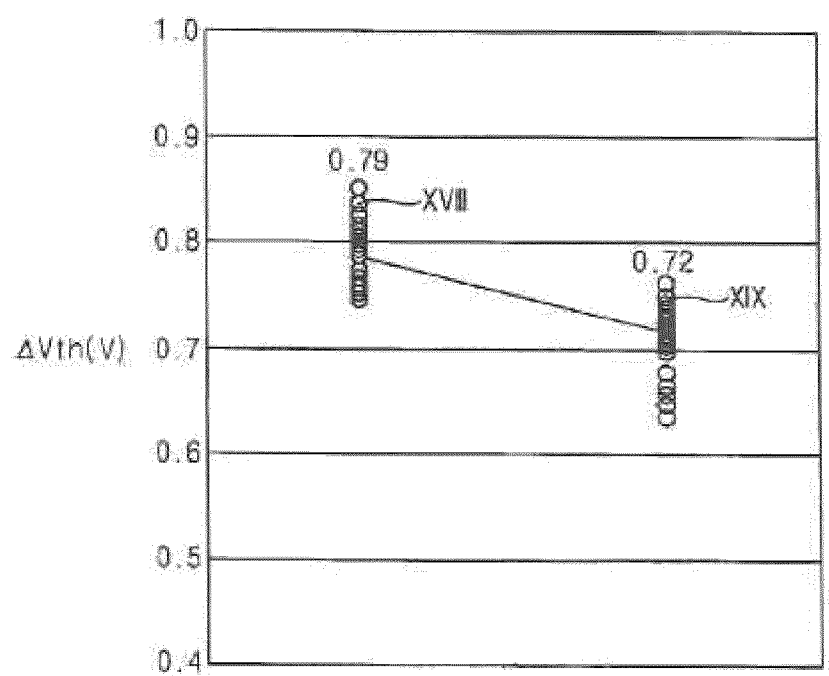
FIG. 35 is a graph illustrating hot temperature stress (HTS) characteristics of insulation structures in accordance with example embodiments of the present invention.

FIG. 35 is a graph illustrating hot temperature stress (HTS) characteristics of insulation structures in accordance with example embodiments of the present invention. In FIG. 35, "XVIII" denotes HTS characteristics of an insulation structure formed by a radical oxidation process, a thermal nitration process and an oxidation process carried out using an oxygen gas and a hydrogen chloride gas. Additionally, "XIX" represents a radical oxidation process, a nitrogen annealing process and an oxidation process carried out using an oxygen gas and a hydrogen chloride gas.

As shown in FIG. 35, the insulation structure XIX obtained the nitrogen annealing process has the HTS characteristics high then those of the insulation structure XVIII formed by the nitrogen nitration process by about 0.07V. When a semiconductor device includes the insulation structure XIX as a tunnel insulation layer or a gate insulation layer, the semiconductor device may have an improved reliability and an enhanced endurance.

Method of Manufacturing a Semiconductor Device

FIGS. 36 to 41 are cross-sectional views illustrating a method of manufacturing a semiconductor device in accordance with example embodiments of the present invention. Although a method of manufacturing a non-volatile semiconductor device such as a flash memory device are illustrated in FIGS. 36 to 41, the features and advantages of the present invention may be employed in manufacturing other volatile semiconductor devices such as dynamic random access memory (DRAM) device or a static random access memory (SRAM) device.

Figure 36:
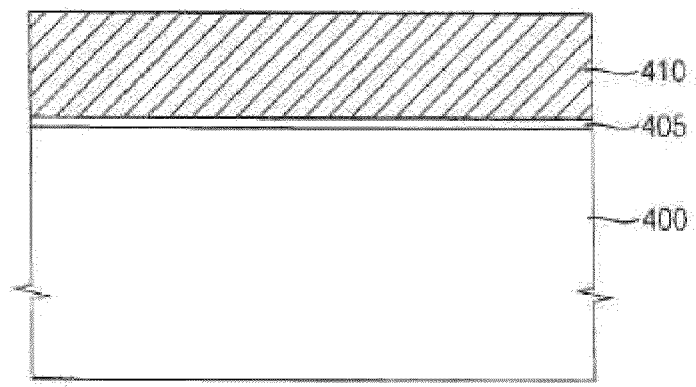
FIGS. 36 to 41 are cross-sectional views illustrating a method of manufacturing a semiconductor device in accordance with example embodiments of the present invention.

Referring to FIG. 36, a pad oxide layer 405 and a mask layer 410 are sequentially formed on a semiconductor substrate 400. The semiconductor substrate 400 may include a silicon substrate, a germanium substrate, a silicon germanium substrate, an SOI substrate, etc.

The pad oxide layer 405 may be formed on the semiconductor substrate 400 by a thermal oxidation process or a chemical vapor deposition (CVD) process. For example, the pad oxide layer 405 may be formed by oxidizing a portion of the semiconductor substrate 400 or by depositing oxide onto the semiconductor substrate 400. The pad oxide layer 405 may include silicon oxide. The pad oxide layer 405 may reduce a stress generated between the semiconductor substrate 400 and the mask layer 410.

The mask layer 410 may be formed using a material that has an etching selectivity relative to the semiconductor substrate 400 and the pad oxide layer 405. For example, the mask layer 410 may be formed using a nitride such as silicon nitride. The mask layer 410 may be formed by a low pressure chemical vapor deposition (LPCVD) process, a plasma-enhanced chemical vapor deposition (PECVD) process, an atomic layer deposition (ALD) process, etc.

Figure 37:
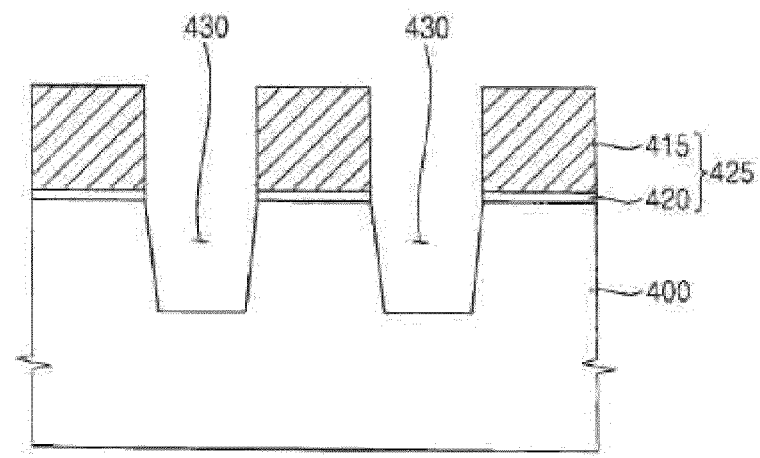

Referring to FIG. 37, a photoresist pattern (not shown) is formed on the mask layer 410, and then the mask layer 410 and the pad oxide layer 405 are partially etched using the photoresist pattern as an etching mask. Thus, a mask structure 425 is formed on the semiconductor substrate 400. The mask structure 425 includes a pad oxide layer pattern 420 and a mask pattern 415 successively formed on the semiconductor substrate 400. The photoresist pattern may be removed from the mask structure 425 by an ashing process and/or a stripping process.

The mask structure 425 exposes predetermined portions of the semiconductor substrate 400. The exposed portions of the semiconductor substrate 400 are partially etched using the mask structure 425 as an etching mask. Hence, trenches 430 are formed at upper portions of the semiconductor substrate 400.

In some example embodiments of the present invention, inner oxide layers (not shown) may be formed on sidewalls of the trenched 430 to cure etched damages to the semiconductor substrate 400 generated in the etching process for forming the trenches 430. Each of the inner oxide layers may be formed using silicon oxide. In one example embodiment, the inner oxide layers may be formed by partially oxidizing portions of the semiconductor substrate 400 corresponding to the sidewalls and bottoms of the trenches 430. In another example embodiment, the inner oxide layers may be formed by depositing oxides on the bottoms and sidewalls of the trenches 430.

Figure 38:
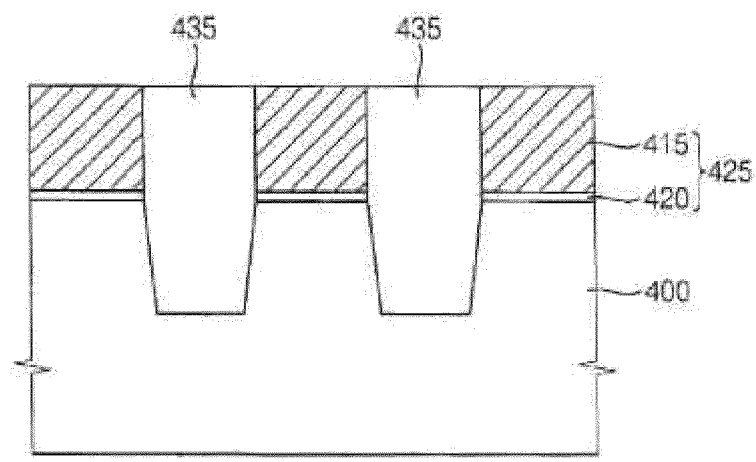

Referring to FIG. 38, an isolation layer (not shown) is formed on the mask structure 425 to fill the trenches 430. The isolation layer may be formed by a CVD process, a PECVD process, a high density plasma-chemical vapor deposition (HDP-CVD) process, an ALD process, etc. The isolation layer may be formed using an oxide such as silicon oxide. For example, the isolation layer may be formed using boro-phosphor silicate glass (BPSG), phosphor silicate glass (PSG), spin on glass (SOG), undoped silicate glass (USG), flowable oxide (FOX), tetraethylorthosilicate (TEOS), plasma-enhanced-tetraethylorthosilicate (PE-TEOS), HDP-CVD oxide, etc. These can be used alone or in a mixture thereof.

The isolation layer is partially removed until the mask structure 425 is exposed so that preliminary isolation layer patterns 435 filling the trenches 430 are formed. Each of the preliminary isolation layer patterns 435 may have a height substantially the same as that of the mask structure 425. When the preliminary isolation layer patterns 435 are formed to fill the trenches 430, active regions and field regions are defined on the semiconductor substrate 400.

Figure 39:
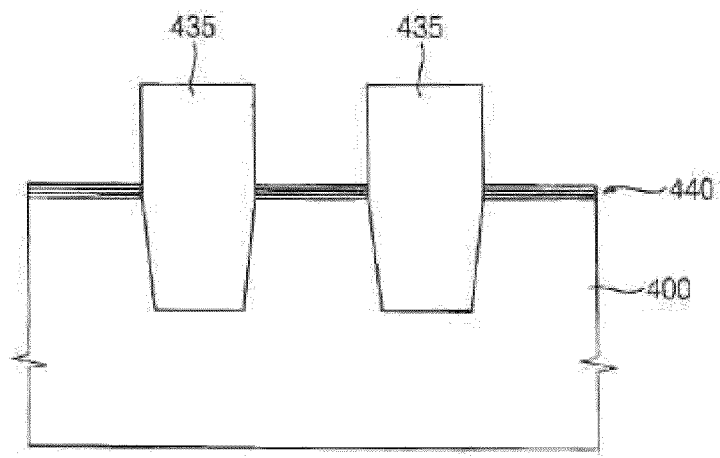

Referring to FIG. 39, the mask structure 425 is removed from the semiconductor substrate 400. Thus, the preliminary isolation layer patterns 435 are protruded from an upper face of the semiconductor substrate 400. The mask structure 425 may be removed by a dry etching process or a wet etching process. When the mask structure 425 is removed from the semiconductor substrate 400, the active regions of the semiconductor substrate 400 are exposed.

Insulation structures 440 are formed on the active regions of the semiconductor substrate 400, respectively. Each of the isolation structures 440 may include multiple oxide layers, nitride layers and/or oxynitride layers. The multiple nitride layers included in the each of the isolation structures 440 may be formed by changing portions of the multiple oxide layers. Further, the multiple oxynitride layers may be formed by fully changing the oxide layers. In some example embodiments, the isolation structures 440 may serve as tunnel insulation layers of memory cells in a non-volatile semiconductor device.

In one example embodiment of the present invention, the insulation structures 440 may be formed by processes substantially the same as those described with reference to FIG. 6. Each of the insulation structure 440 may include a nitride layer, a lower oxide layer and an upper oxide layer sequentially formed on the active region. Particularly, a first preliminary oxide layer may be formed on the active region by a first oxidation process, and then a preliminary nitride layer and a second preliminary oxide layer may be formed on the active region by a nitration process. The first preliminary oxide layer may be formed by partially oxidizing the active region of the semiconductor substrate 400, and a lower portion of the first preliminary oxide layer may be changed into the nitride layer. Here, the first preliminary oxide layer may be converted into the second preliminary oxide layer. Then, the insulation structure 440 having the nitride layer, the lower oxide layer and the upper oxide layer may be formed on the active region by a second oxidation process. The nitride layer may be formed from the preliminary nitride layer and the lower oxide layer may be formed from the second preliminary oxide layer. Additionally, the upper oxide layer may be formed from the second preliminary oxide layer.

In another example embodiment of the present invention, the insulation structures 440 may be formed by processes substantially the same as those described with reference to FIG. 10. Thus, each of the insulation structure 440 may include a lower nitride layer, an oxide layer and an upper nitride layer. After a first preliminary oxide layer may be formed on the active region by an oxidation process, the lower nitride layer and a second preliminary oxide layer may be formed on the active region by a first nitration process. The first preliminary oxide layer may be formed by partially oxidizing the semiconductor substrate 400, and the lower nitride layer may be formed from a lower portion of the first preliminary oxide layer. The second preliminary oxide layer may be formed from the first preliminary oxide layer. The lower nitride layer, the oxide layer and the upper oxide layer may be formed on the active region by a second nitration process. The second preliminary oxide layer may be changed into the oxide layer and the upper nitride layer may be formed from an upper portion of the second preliminary oxide layer.

In still another example embodiment of the present invention, the insulation structures 440 may be formed by processes substantially the same as those described with reference to FIG. 14. Each of the insulation structures 440 may include a nitride layer, a lower oxide layer and an upper oxide layer. Particularly, a preliminary nitride layer and a preliminary oxide layer may be formed on the active region by simultaneously performing a first oxidation process and a nitration process. The preliminary oxide layer may be obtained by partially oxidizing the semiconductor substrate 400 and the preliminary nitride layer may be formed by accumulating nitrogen atoms at a portion of the semiconductor substrate 400 under the preliminary oxide layer. The nitride layer, the lower oxide layer and the upper oxide layer may be formed on the active region by a second oxidation process. The nitride layer may be formed from the preliminary nitride layer and the lower oxide layer may be formed from the preliminary oxide layer. Further, the upper oxide layer may be obtained by partially oxidizing the preliminary oxide layer.

In still another example embodiment of the present invention, the insulation structures 440 may be formed by processes substantially the same as those described with reference to FIG. 18. Each of the insulation structures 440 may include a lower nitride layer, a lower oxide layer, an upper oxide layer and an upper nitride layer. After a first preliminary oxide layer may be formed on the active region by a first oxidation process, a preliminary lower nitride layer and a second preliminary oxide layer may be formed on the active region by a first nitration process. The first preliminary oxide layer may be obtained by partially oxidizing the semiconductor substrate 400 and the preliminary lower nitride layer may be formed by nitrifying a lower portion of the first preliminary oxide layer. The second preliminary oxide layer may be formed from the first preliminary oxide layer. A second oxidation process may be performed to form the lower nitride layer, the lower nitride layer and a preliminary upper oxide layer on the active region. The lower nitride layer may be formed from the preliminary lower nitride layer and the lower oxide layer may be obtained from the second preliminary oxide layer. The preliminary upper oxide layer may be formed from an upper portion of the second preliminary oxide layer. A second nitration process may be carried out to form the lower nitride layer, the lower oxide layer, the upper oxide layer and the upper nitride layer on the active region. The preliminary upper oxide layer may be changed into the upper oxide layer and the upper nitride layer may be obtained by partially nitrifying the preliminary upper oxide layer.

In still another example embodiment of the present invention, the insulation structures 440 may be formed by processes substantially the same as those described with reference to FIG. 23. Each of the insulation structures 440 may include a lower nitride layer, a lower oxide layer an upper oxide layer and an upper nitride layer. A first oxidation process and a first nitration process may be carried out to form a preliminary lower oxide layer and a preliminary lower nitride layer on the active region. The preliminary lower oxide layer may be obtained by partially oxidizing the semiconductor substrate 400 and the preliminary lower nitride layer may be formed by accumulating nitrogen atoms at a portion of the semiconductor substrate 400. The lower nitride layer, the lower oxide layer and a preliminary upper oxide layer may be formed on the active region by a second oxidation process. The lower nitride layer may be formed from the preliminary lower nitride layer and the lower oxide layer may be obtained from the preliminary lower oxide layer. The preliminary upper oxide layer may be formed by oxidizing an upper portion of the preliminary lower oxide layer. A second nitration process may be executed to form the lower nitride layer, the lower oxide layer, the upper nitride layer and the upper nitride layer on the active region. The upper oxide layer may be obtained from the preliminary upper oxide layer and the upper nitride layer may be formed by partially nitrifying the preliminary upper oxide layer.

In still another example embodiment of the present invention, the insulation structures 440 may be formed by processes substantially the same as those described with reference to FIG. 28. Each of the insulation structures 440 may include an oxynitride layer. A first oxidation process may be carried out to form an oxide layer on the active region, and then the oxide layer may be fully changed into a preliminary oxynitride layer by a nitrogen annealing process. A second oxidation process may be performed to form the oxynitride layer on the active region.

Figure 40:
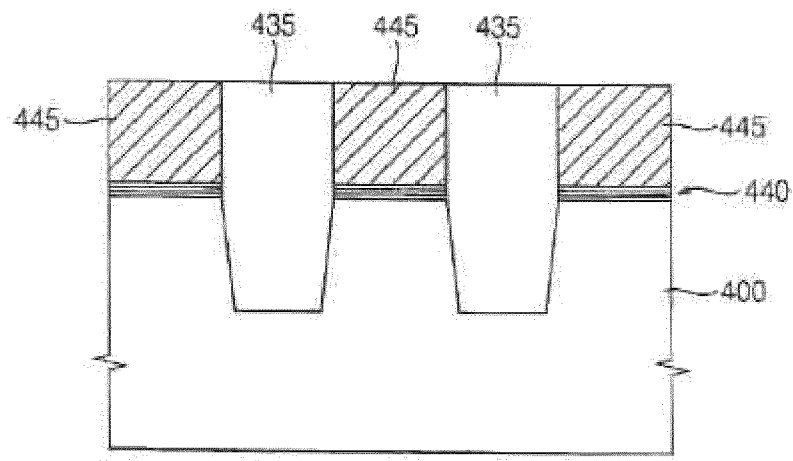

Referring to FIG. 40, floating gates 445 are formed on the insulation structures 440 positioned between the preliminary isolation layer patterns 435. IN some example embodiments, each of the floating gates 445 may be formed by a self-aligned poly (SAP) process. Particularly, a first conductive layer including polysilicon may be formed on the insulation structures 440 and the preliminary isolation layer patterns 435, and then the first conductive layer may be partially removed until the preliminary isolation layer patterns 435. Hence, the floating gates 445 may be formed on the insulation structures 440 between the preliminary isolation layer patterns 435. The first conductive layer may be removed by a chemical mechanical polishing (CMP) process and/or and etch back process.

In an example embodiment of the present invention, each of the floating gates 445 may have a height substantially the same as that of each preliminary isolation layer patterns 435. Additionally, the preliminary isolation layer patterns 435 may serve as molds for forming the floating gates 445.

Figure 41:
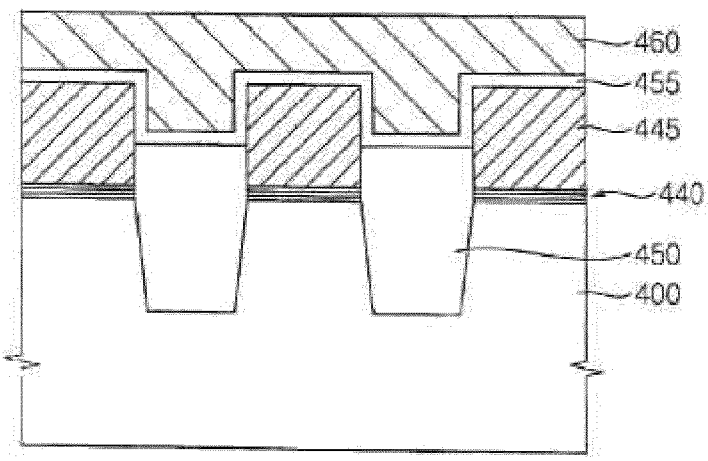

Referring to FIG. 41, the preliminary isolation layer patterns 435 are partially etched to form isolation layer patterns 450 between the floating gates 445. The preliminary isolation layer patterns 435 may be etched by a dry etching process or a wet etching process. Since the isolation layer patterns 450 have heights substantially higher than those of the floating gates 445, sidewalls of the floating gates 445 are exposed after formations of the isolation layer patterns 450.

A dielectric layer 455 is formed on the isolation layer patterns 450 and the exposed sidewalls of the floating gates 450. The dielectric layer 455 may be formed by a CVD process, a PECVD process, an ALD process, a sputtering process, an electron beam evaporation process, a PLD process, etc. In one example embodiment, the dielectric layer 455 may be formed using a metal oxide having a high dielectric constant. For example, the dielectric layer 455 may be formed using hafnium oxide, zirconium oxide, titanium oxide, tantalum oxide, etc. In another example embodiment, the dielectric layer 455 may have an oxide/nitride/oxide (ONO) structure that includes a lower oxide film, a nitride film and an upper oxide film.

A control gate 460 is formed on the dielectric layer. The control gate 460 may be formed by a sputtering process, a CVD process, an ALD process, a PLD process, an electron beam evaporation process, etc. Further, the control gate 460 may be formed using doped polysilicon, metal or conductive metal nitride.

According to some example embodiments of the present invention, an insulation structure may include at least one oxide layer, at least one nitride layer and/or at least one oxynitride layer obtained by various oxidation, nitration and/or annealing processes. The insulation structure may include a central portion and a peripheral portion having a thickness substantially the same as or substantially thicker than that of the central portion. Particularly, an edge portion of the insulation structure may have a thickness substantially the same as or substantially thicker than that of the central portion. Thus, memory cells of a semiconductor device may have a uniform threshold voltage distribution when the semiconductor device includes the insulation structure as a tunnel insulation layer or a gate insulation layer. Further, nitrogen atoms may be uniformly distributed in the insulation structure so that generations of charge trapping sites in the insulation structure may be effectively prevented in a programming operation and an erasing operation of the semiconductor device. As a result, the semiconductor device including the insulation structure may have an improved reliability and an enhanced endurance.

Evaluation of Electrical Characteristics of Semiconductor Devices

Figure 42:
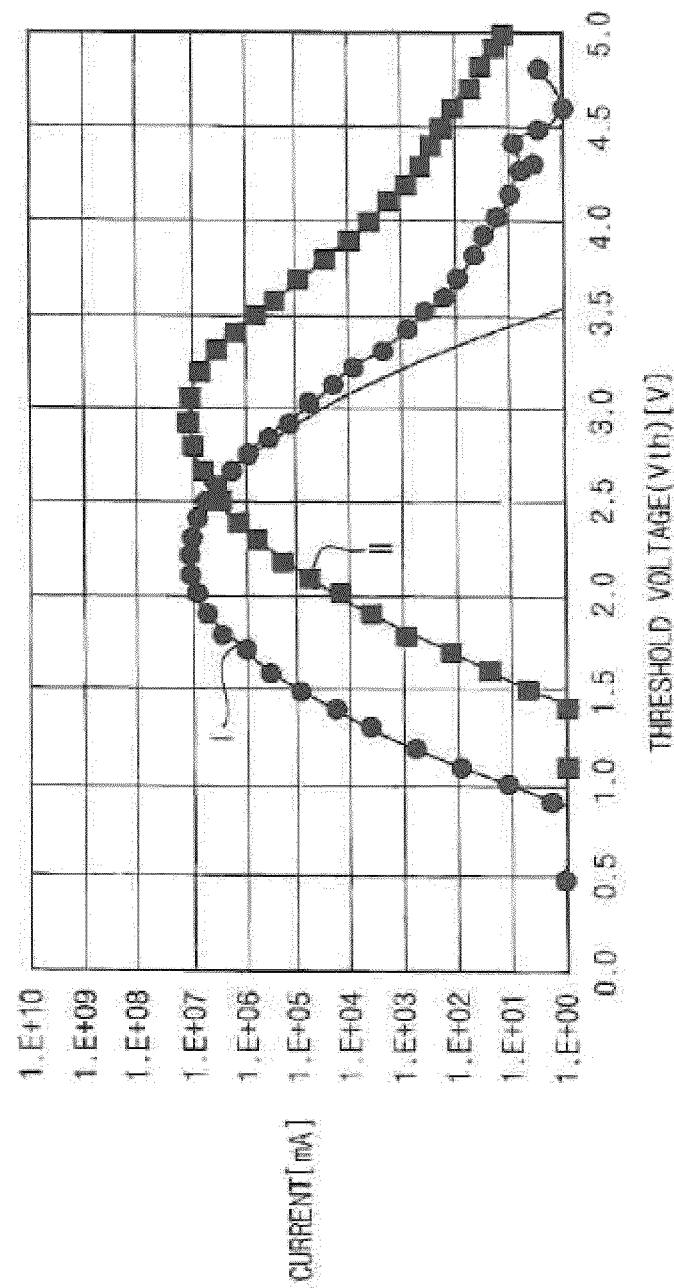
FIG. 42 is a graph illustrating threshold voltage (Vth) distributions of memory cells of a first non-volatile semiconductor device including first insulation structures as tunnel insulation layers.
Figure 43:
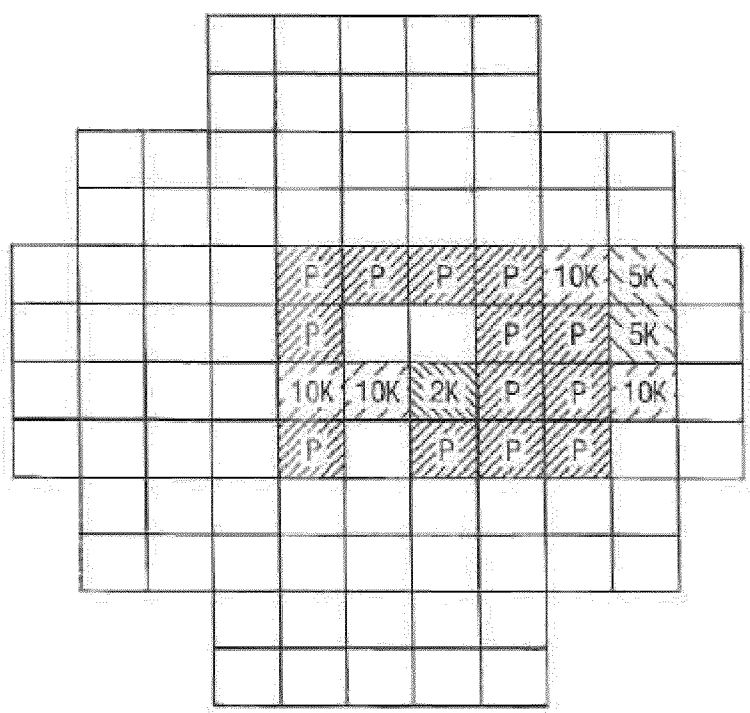
FIG. 43 is a plane view illustrating results of endurance tests for the memory cells of the first non-volatile semiconductor device.

FIG. 42 is a graph illustrating threshold voltage (Vth) distributions of memory cells of a first non-volatile semiconductor device including first insulation structures as tunnel insulation layers. Each of the first insulation structures is obtained by a radical oxidation process and a nitration process. FIG. 43 is a plane view illustrating results of endurance tests for the memory cells of the first non-volatile semiconductor device. In FIG. 42, "I" means an initial threshold voltage distribution of memory cells of the first non-volatile semiconductor device, and "II" indicates a threshold voltage distribution of the memory cells of the first non-volatile semiconductor device after performing about 1,200 cycles of an endurance test. In FIG. 43, "P" denotes memory cells of the first non-volatile semiconductor device successfully pass about 10,000 cycles of an endurance test, whereas "2K", "5K" and "10K" indicate memory cells of the first non-volatile semiconductor device fail to stand about 2,000 cycles of the endurance test, about 5,000 cycles of the endurance test and about 10,000 cycles of the endurance test, respectively.

Referring to FIG. 42, the initial threshold voltage distribution I of the memory cells of the first non-volatile semiconductor device has a relatively large value of about 3.7 eV. After the above endurance test is performed about the memory cells of the first non-volatile semiconductor device, the threshold voltage distribution II of the memory cells of the first non-volatile semiconductor device may have a value above about 3.8 eV because the first non-volatile semiconductor device includes some memory cells passing the endurance test and other memory cells failing to stand the endurance test.

As shown in FIG. 43, the first non-volatile semiconductor device including the first insulation structures has memory cells that do not pass the endurance test after performing about 2,000 cycles, and then about 15 percent of the memory cells of the non-volatile semiconductor device fail to stand the endurance test after about 5,000 cycles of the endurance test are carried out. Further, about 35 percent of the memory cells of the non-volatile semiconductor device do not pass the endurance test after performing about 10,000 cycles.

Figure 44:
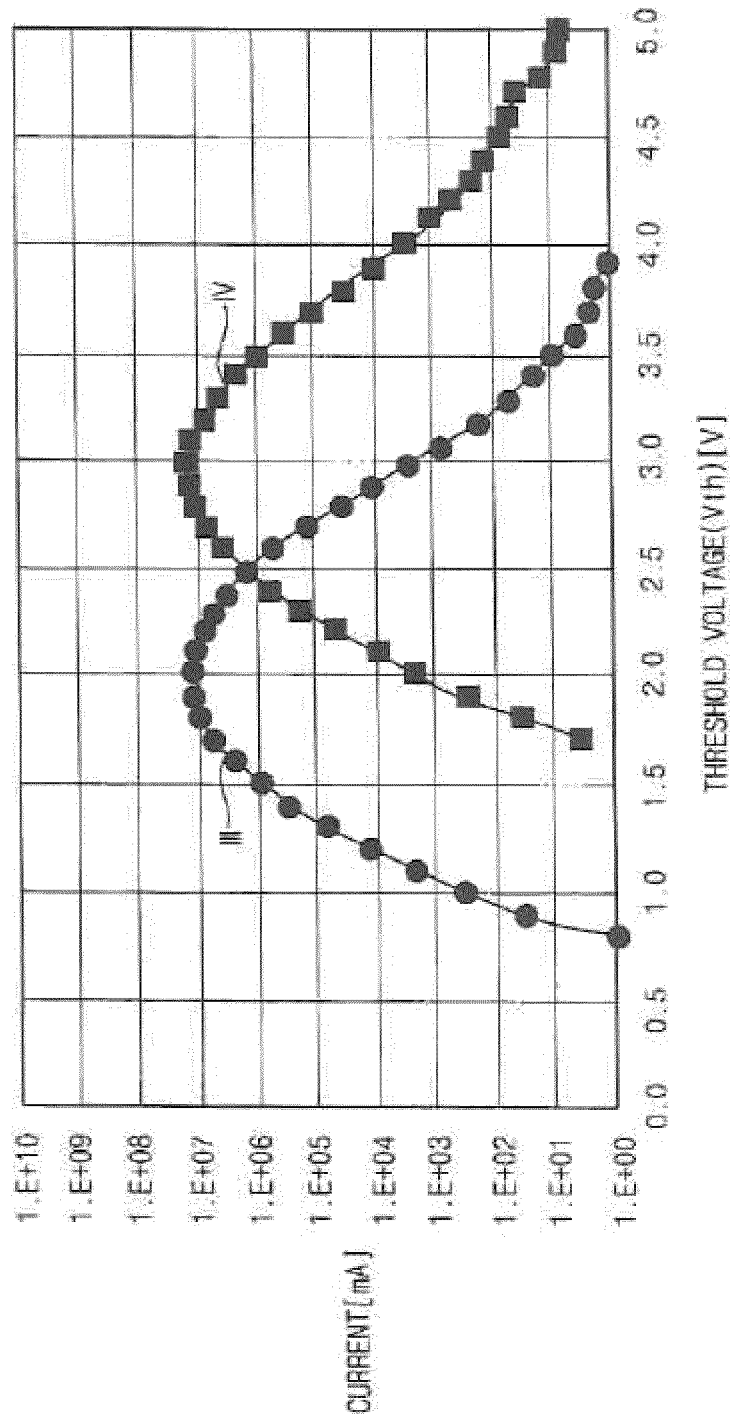
FIG. 44 is a graph illustrating threshold voltage distributions of memory cells of a second non-volatile semiconductor device including second insulation structures as tunnel insulation layers.

FIG. 44 is a graph illustrating threshold voltage distributions of memory cells of a second non-volatile semiconductor device including second insulation structures as tunnel insulation layers. Each of the second insulation structures is formed by a first radical oxidation process, a nitration process and a second radical oxidation process.

In FIG. 44, "III" represents an initial threshold voltage distribution of memory cells of the second non-volatile semiconductor device, and "IV" denotes a threshold voltage distribution of the memory cells of the second non-volatile semiconductor device after performing about 1,200 cycles of an endurance test. In FIG. 44, each of the second insulation structures includes a nitride layer, a lower oxide layer and an upper oxide layer formed on a semiconductor substrate.

As shown in FIG. 44, the threshold voltage distribution III of the memory cells of the second non-volatile semiconductor device is about 3.1 eV considerably smaller than that of the initial threshold voltage distribution I of the memory cells of the first non-volatile semiconductor device by about 0.7V. After the endurance test is executed about the memory cells of the second non-volatile semiconductor device, the threshold voltage distribution IV of the memory cells of the second non-volatile semiconductor device is above about 3.1 eV because the second non-volatile semiconductor device includes some memory cells passing the endurance test and other memory cells failing to stand the endurance test.

Figure 45:
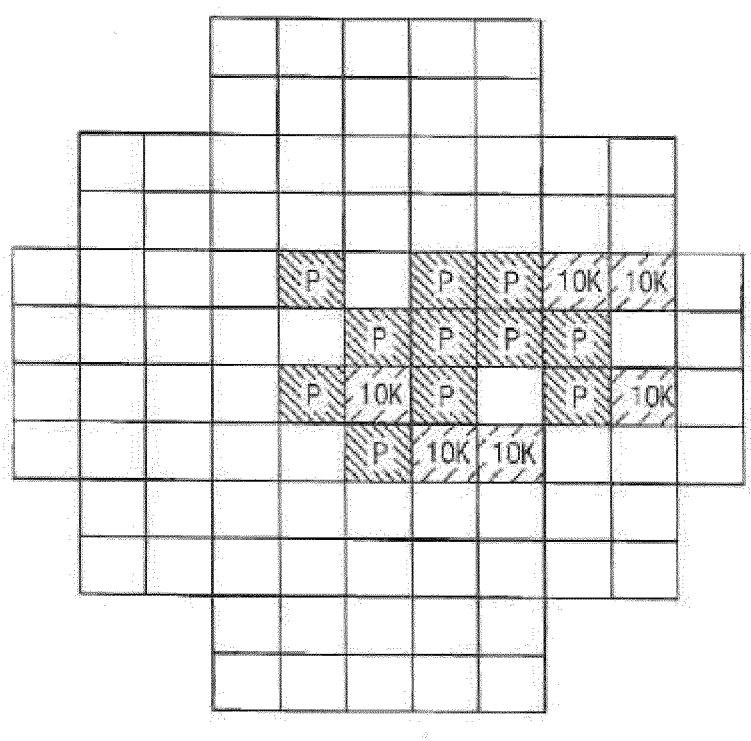
FIG. 45 is a plane view illustrating results of endurance tests for the memory cells of the second non-volatile semiconductor device.

FIG. 45 is a plane view illustrating results of endurance tests for the memory cells of the second non-volatile semiconductor device. In FIG. 45, "P" means memory cells of the second non-volatile semiconductor device pass about 10,000 cycles of an endurance test, whereas "10K" represents memory cells of the second non-volatile semiconductor device fail to stand about 10,000 cycles of the endurance test.

Referring to FIG. 45, all of the memory cells of the second non-volatile semiconductor device successfully pass about 2,000 cycles and about 5,000 cycles of the endurance test. After performing about 10,000 cycles of the endurance test, about 35 percent of the memory cells of the second non-volatile semiconductor device do not pass the endurance test. That is, about 65 percent of the memory cells of the second non-volatile semiconductor device pass about 10,000 cycles of the endurance test. Thus, the second non-volatile semiconductor device may have an endurance superior to that of the first non-volatile semiconductor device.

Figure 46:
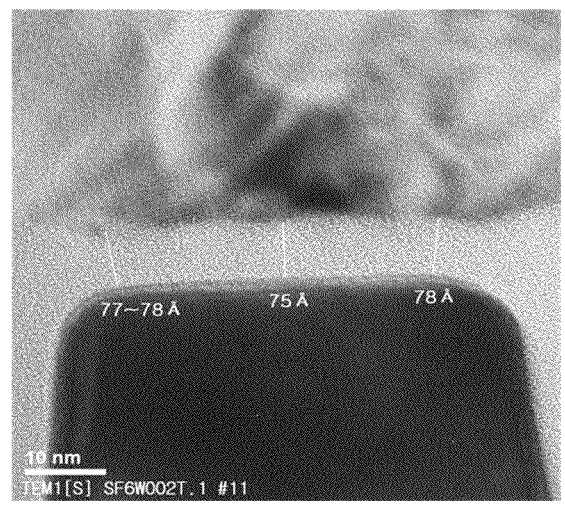
FIG. 46 is an electron microscopic picture illustrating the memory cell of the second non-volatile semiconductor device including the second insulation structure as the tunnel insulation layer.

FIG. 46 is an electron microscopic picture illustrating the memory cell of the second non-volatile semiconductor device including the second insulation structure as the tunnel insulation layer. In FIG. 46, the second insulation structure includes a nitride layer, a lower oxide layer and an upper oxide layer.

As shown in FIG. 46, a central portion of the second insulation structure has a thickness of about 75 Å whereas a peripheral portion of the second insulation structure including an edge portion has a thickness of about 77 Å to about 78 Å. Thus, the peripheral portion of the second insulation structure has the thickness substantially the same or substantially thicker than that of the central portion of the second insulation structure. When the second insulation structure is used as a tunnel insulation layer of a non-volatile semiconductor device, memory cells of the non-volatile semiconductor device may have a uniform threshold voltage distribution.

Figure 47:
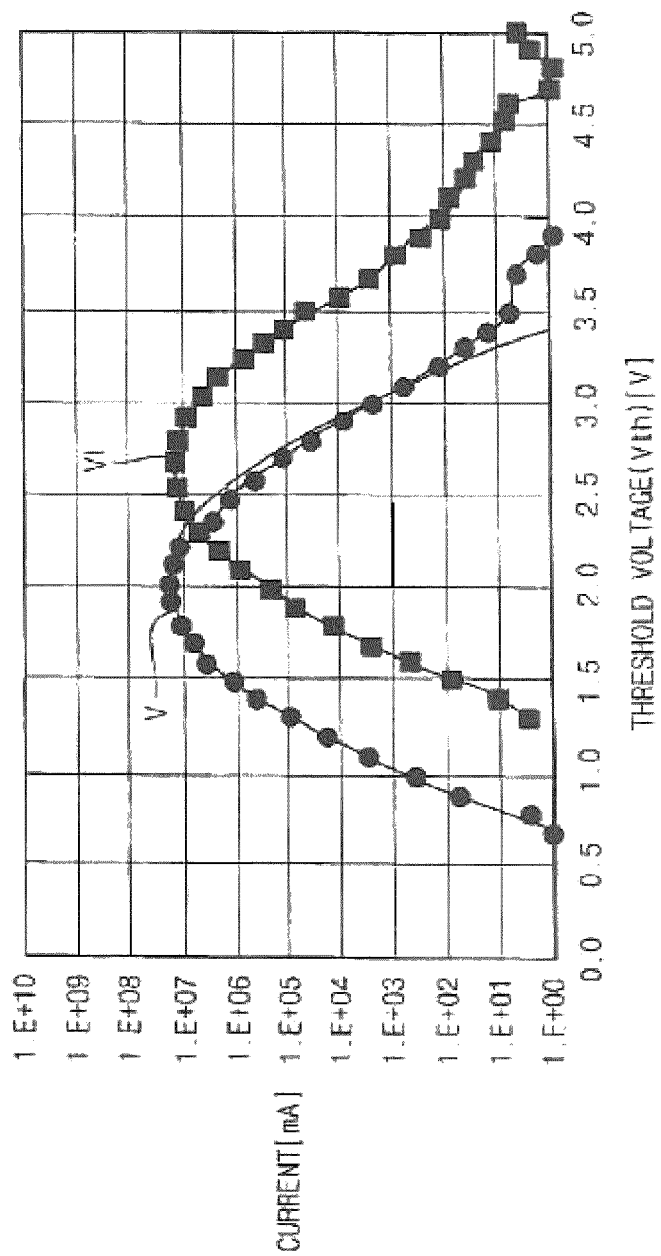
FIG. 47 is a graph illustrating threshold voltage distributions of memory cells of a third non-volatile semiconductor device including third insulation structures as tunnel insulation layers.
Figure 48:
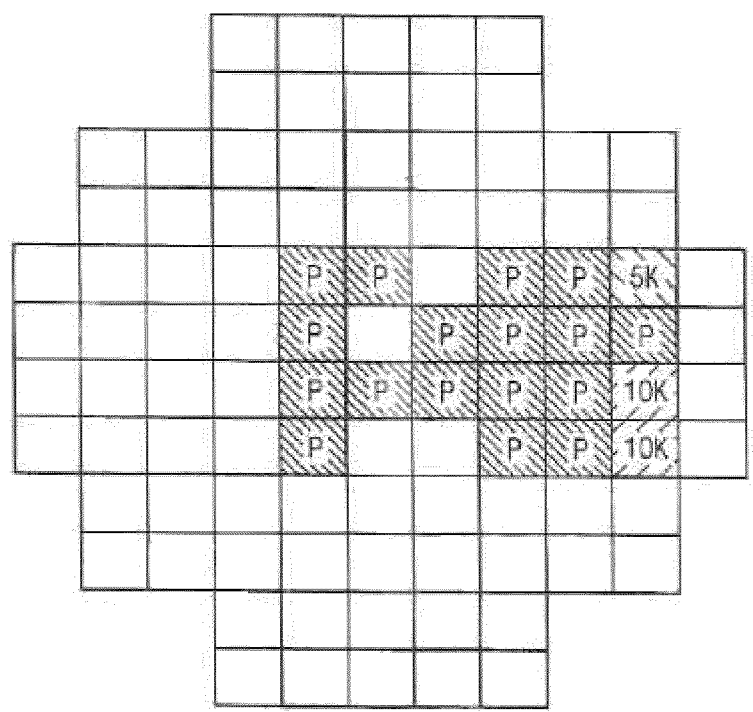
FIG. 48 is a plane view illustrating results of endurance tests for the memory cells of the third non-volatile semiconductor device.

FIG. 47 is a graph illustrating threshold voltage distribution of memory cells of a third non-volatile semiconductor device including third insulation structures as tunnel insulation layers. Each of the third insulation structures is obtained by a radical oxidation process, a nitration process and a dry oxidation process. FIG. 48 is a plane view illustrating results of endurance tests for the memory cells of the third non-volatile semiconductor device. In FIG. 47, "V" denotes initial threshold voltage distributions of memory cells of the third non-volatile semiconductor device, and "VI" represents threshold voltage distributions of the memory cells of the third non-volatile semiconductor device after performing about 1,200 cycles of an endurance test. In FIG. 48, "P" means memory cells of the third non-volatile semiconductor device pass about 10,000 cycles of an endurance test, whereas "5K" and "10K" indicates memory cells of the third non-volatile semiconductor device do not pass about 5,000 cycles of the endurance test and about 10,000 cycles of the endurance test, respectively.

Referring to FIG. 47, the threshold voltage distribution V of the memory cells of the third non-volatile semiconductor device is about 3.4 eV smaller than that of the initial threshold voltage distribution I of the memory cells of the first non-volatile semiconductor device by about 0.4V. After the endurance test is executed about the memory cells of the third non-volatile semiconductor device, the threshold voltage distribution VI of the memory cells of the third non-volatile semiconductor device is above about 3.4 eV since some memory cells of the third non-volatile semiconductor device fail to stand the endurance test.

As shown in FIG. 48, about 5 percent of the memory cells of the third non-volatile semiconductor device do not pass about 5,000 cycles of the endurance test. After performing about 10,000 cycles of the endurance test, about 15 percent of the memory cells of the third non-volatile semiconductor device fail to stand the endurance test. Namely, about 85 percent of the memory cells of the third non-volatile semiconductor device pass about 10,000 cycles of the endurance test. Therefore, the third non-volatile semiconductor device may have an endurance relatively superior to that of the first non-volatile semiconductor device.

Figure 49:
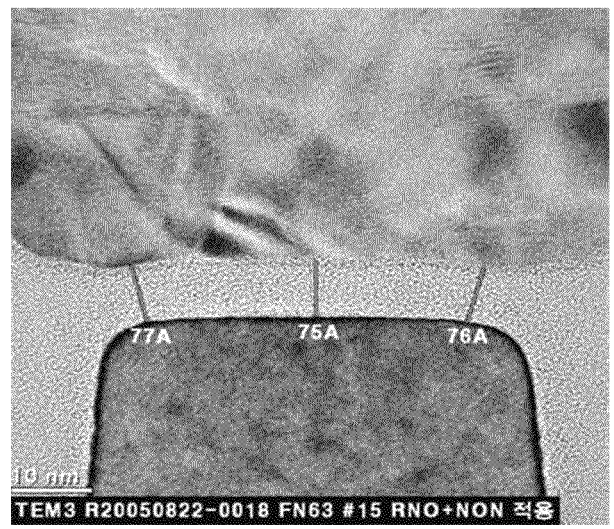
FIG. 49 is an electron microscopic picture illustrating the memory cell of the third non-volatile semiconductor device including the third insulation structure as the tunnel insulation layer.

FIG. 49 is an electron microscopic picture illustrating the memory cell of the third non-volatile semiconductor device including the third insulation structure as the tunnel insulation layer.

As shown in FIG. 49, a central portion of the third insulation structure has a thickness of about 75 Å whereas a peripheral portion of the third insulation structure including an edge portion has a thickness of about 76 Å to about 77 Å. Hence, the peripheral portion of the third insulation structure has the thickness substantially the same or substantially thicker than that of the central portion of the third insulation structure. When the third insulation structure is used as a tunnel insulation layer of a non-volatile semiconductor device, memory cells of the non-volatile semiconductor device may have a uniform threshold voltage distribution.

Figure 50:
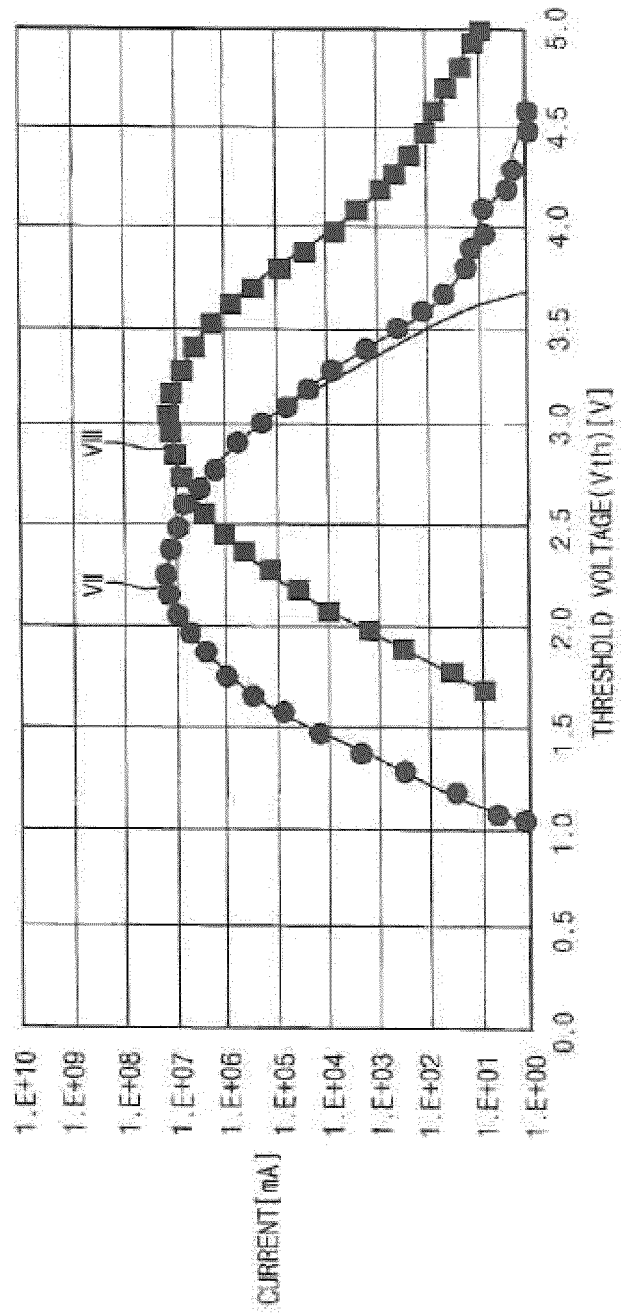
FIG. 50 is a graph illustrating threshold voltage distributions of memory cells of a fourth non-volatile semiconductor device including fourth insulation structures as tunnel insulation layers.

FIG. 50 is a graph illustrating threshold voltage distributions of memory cells of a fourth non-volatile semiconductor device including fourth insulation structures as tunnel insulation layers. Each of the fourth insulation structure is formed by a radical oxidation process, a thermal nitration process and a clean oxidation process. In FIG. 50, "VII" represents initial threshold voltage distributions of memory cells of the fourth non-volatile semiconductor device, and "VIII" means threshold voltage distributions of the memory cells of the fourth non-volatile semiconductor device after performing about 1,200 cycles of an endurance test.

Referring to FIG. 50, the threshold voltage distribution VII of the memory cells of the fourth non-volatile semiconductor device is about 3.5 eV relatively smaller than that of the initial threshold voltage distribution I of the memory cells of the first non-volatile semiconductor device by about 0.2V. After the endurance test is executed about the memory cells of the fourth non-volatile semiconductor device, the threshold voltage distribution VIII of the memory cells of the fourth non-volatile semiconductor device is above about 3.5 eV since some memory cells of the fourth non-volatile semiconductor device do not pass predetermined cycles of the endurance test.

Figure 51:
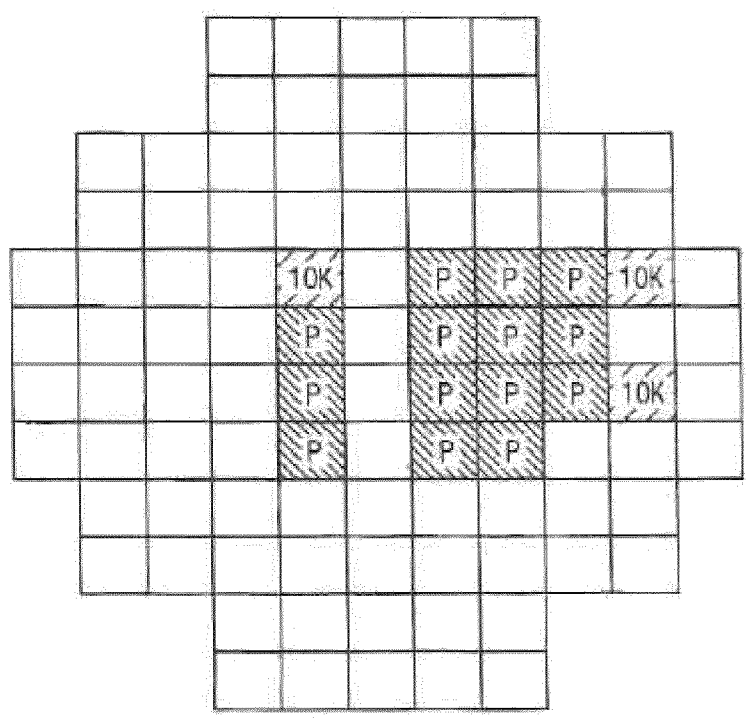
FIG. 51 is a plane view illustrating results of endurance tests for the memory cells of the fourth non-volatile semiconductor device.

FIG. 51 is a plane view illustrating results of endurance tests for the memory cells of the fourth non-volatile semiconductor device. In FIG. 51, "P" means memory cells of the fourth non-volatile semiconductor device meet about 10,000 cycles of an endurance test, whereas "10K" denotes memory cells of the fourth non-volatile semiconductor device do not meet about 10,000 cycles of the endurance test.

As shown in FIG. 51, all of the memory cells of the fourth non-volatile semiconductor device successfully pass about 10,000 cycles of the endurance test. After performing about 10,000 cycles of the endurance test, about 12 percent of the memory cells of the fourth non-volatile semiconductor device do not pass the endurance test. That is, about 88 percent of the memory cells of the fourth non-volatile semiconductor device pass about 10,000 cycles of the endurance test. Hence, the fourth non-volatile semiconductor device may have an endurance greatly superior to that of the first non-volatile semiconductor device.

Figure 52:
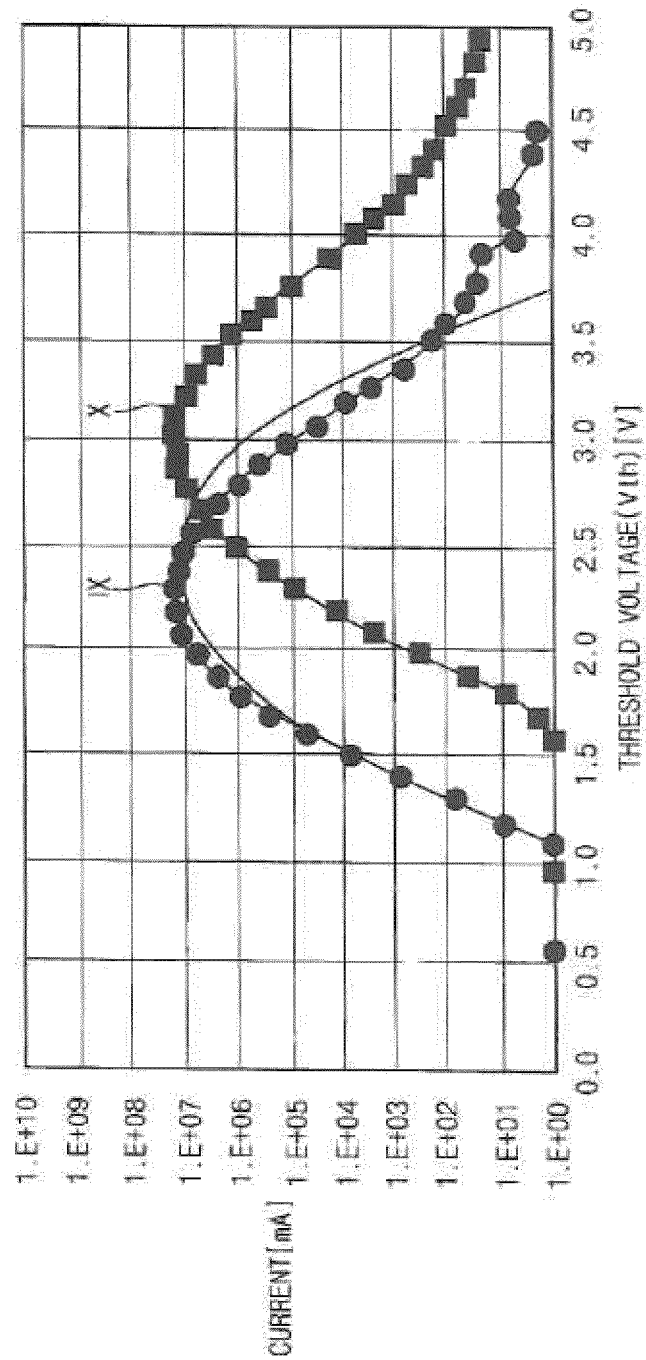
FIG. 52 is a graph illustrating threshold voltage distributions of memory cells of a fifth non-volatile semiconductor device including fifth insulation structures as tunnel insulation layers.
Figure 53:
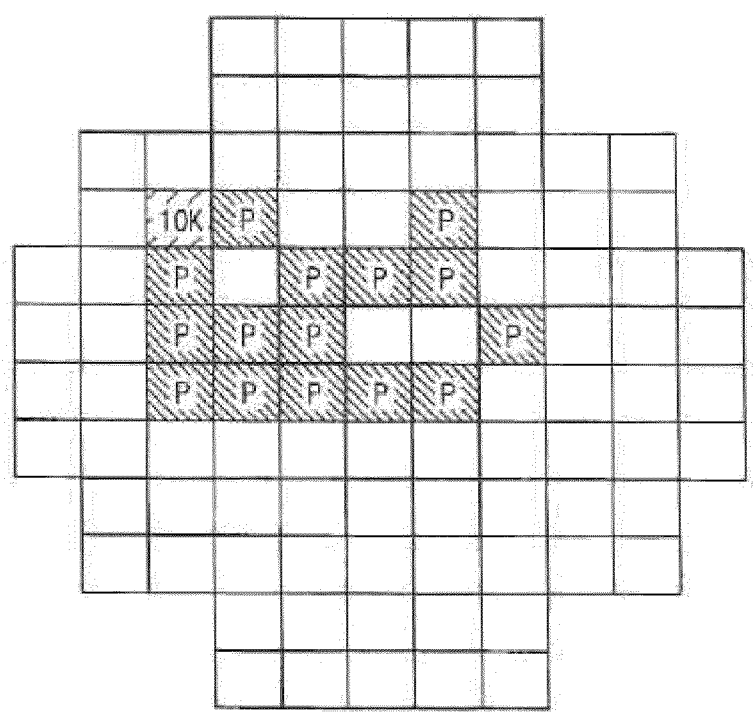
FIG. 53 is a plane view illustrating results of endurance tests for the memory cells of the fifth non-volatile semiconductor device.

FIG. 52 is a graph illustrating threshold voltage distributions of memory cells of a fifth non-volatile semiconductor device including fifth insulation structures as tunnel insulation layers. Each of the fifth insulation structure is obtained by radical oxidation process, a thermal nitration process, a dry oxidation process and a plasma nitration process. FIG. 53 is a plane view illustrating results of endurance tests for the memory cells of the fifth non-volatile semiconductor device. In FIG. 52, "IX" indicates initial threshold voltage distributions of memory cells of the fifth non-volatile semiconductor device, and "X" denotes threshold voltage distributions of the memory cells of the fifth non-volatile semiconductor device after performing about 1,200 cycles of an endurance test. In FIG. 53, "P" means memory cells of the fifth non-volatile semiconductor device meet about 10,000 cycles of an endurance test, whereas "10K" denotes memory cells of the fifth non-volatile semiconductor device do not meet about 10,000 cycles of the endurance test.

Referring to FIG. 52, the threshold voltage distribution IX of the memory cells of the fifth non-volatile semiconductor device is about 3.2 eV considerably smaller than that of the initial threshold voltage distribution I of the memory cells of the first non-volatile semiconductor device by about 0.4V. After the endurance test is executed about the memory cells of the fifth non-volatile semiconductor device, the threshold voltage distribution X of the memory cells of the fifth non-volatile semiconductor device is above about 3.2 eV because some memory cells of the fifth non-volatile semiconductor device fail to stand predetermined cycles of the endurance test.

As shown in FIG. 53, all of the memory cells of the fifth non-volatile semiconductor device successfully pass about 10,000 cycles of the endurance test. After performing about 10,000 cycles of the endurance test, about 6.3 percent of the memory cells of the fifth non-volatile semiconductor device do not pass the endurance test. That is, about 93.7 percent of the memory cells of the fifth non-volatile semiconductor device pass about 10,000 cycles of the endurance test. Therefore, the fifth non-volatile semiconductor device may have an endurance greatly superior to that of the first non-volatile semiconductor device.

Figure 54:
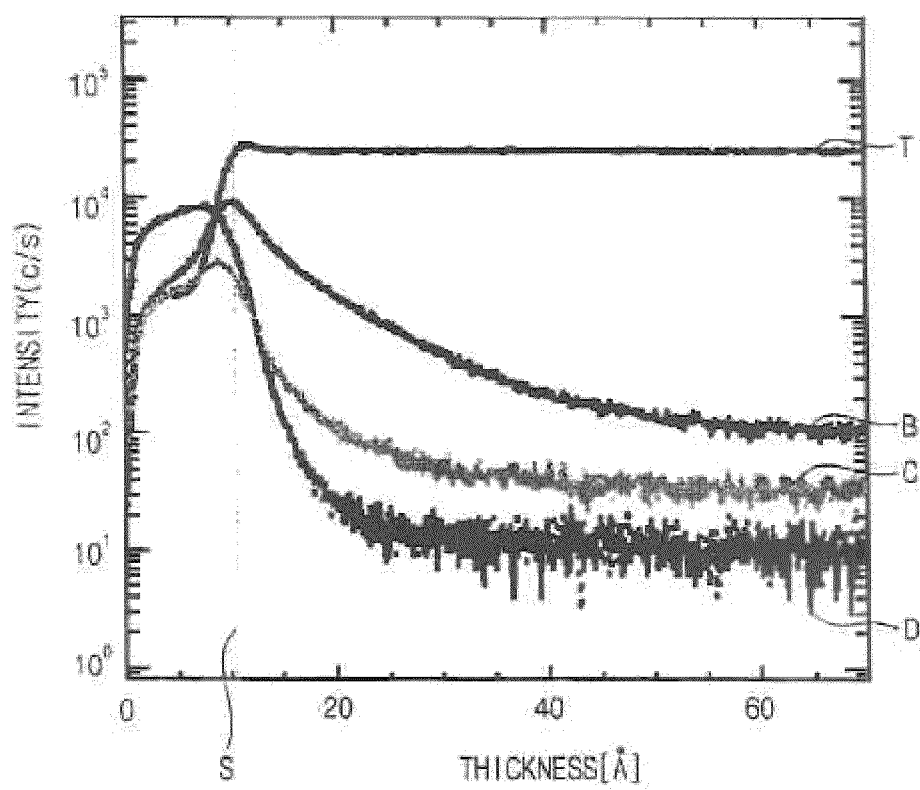
FIG. 54 is a graph illustrating contents of ingredients in insulation structures in accordance with example embodiments of the present invention.

FIG. 54 is a graph illustrating contents of ingredients in an insulation structure in accordance with example embodiments of the present invention. In FIG. 54, the insulation structure is obtained by simultaneously performing a dry oxidation process and a nitration process at a temperature of about 850° C. The insulation structure has a thickness of about 65 Å measured from an upper face of a semiconductor substrate. In FIG. 54, "T" indicates a content of silicon in the insulation structure, "B" means a content of silicon nitride in the insulation structure, and "C" represents a content of silicon monoxide in the insulation structure. Further, "D" denotes a content of silicon oxide in the insulation structure and "S" represents an interface between the insulation structure and the semiconductor substrate. The contents of the ingredients in the insulation structure are measured by a TOF-SIMS analysis.

As shown in FIG. 54, silicon-nitrogen bonds (the content of silicon nitride B) are widely distributed from an upper portion of the insulation structure to the interface S between the insulation structure and the semiconductor substrate. That is, the insulation structure may have a uniform content of silicon nitride B from the upper portion to a lower portion thereof. Therefore, the insulation structure may ensure excellent electrical characteristics and charge trapping sites in the insulation structure may be considerably reduced.

According to the present invention, an insulation structure including multiple oxide layers, nitride layers and/or oxynitride layers may be obtained by at least one oxidation process and at least one nitration process. The obtained multiple nitride layers and oxynitride layers may be formed from a portion of the oxide layer by a nitration process or a nitrogen annealing process. A peripheral portion of the insulation structure including an edge portion may have a thickness substantially the same as that of a central portion of the insulation structure so that the insulation structure may have a uniform thickness and enhanced electrical characteristics.

When the insulation structure is employed as a tunnel insulation layer or a gate insulation layer in a semiconductor device, the semiconductor device may have improved endurance and desired electrical characteristics because memory cells of the semiconductor device may have a uniform distribution of threshold voltages.

Since nitrogen atoms may be uniformly distributed in the insulation structure, charge trapping sites generated in the insulation structure may be considerably reduced. Therefore, the semiconductor device including the insulation structure may have more improved endurance and reliability.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a semiconductor device, comprising:
    forming isolation layer patterns on a substrate, each of the isolation layer patterns having a lower portion buried in the substrate and an upper portion protruding from the substrate;
    forming an insulation structure on a portion of the substrate between the isolation layer patterns, the insulation structure comprising at least one oxide layer formed by at least one oxidation process and at least one nitride layer formed by at least one nitration process;
    forming a floating gate on the insulation structure;
    forming a dielectric layer on the floating gate; and
    forming a control gate on the dielectric layer,
    wherein forming the insulation structure includes,
    performing a first oxidation process to form a first preliminary oxide layer on the substrate by partially oxidizing the substrate;
    performing a first nitration process to form a preliminary nitride layer on the substrate by changing a lower portion of the preliminary oxide layer, and a second preliminary oxide layer from the first preliminary oxide layer on the preliminary nitride layer; and performing a second oxidation process to form a lower nitride layer from the preliminary nitride layer on the substrate, a lower oxide layer from the second preliminary oxide layer on the lower nitride layer, and a first upper oxide layer from the second preliminary oxide layer on the lower oxide layer.

2. A method of manufacturing a semiconductor device, comprising:

forming isolation layer patterns on a substrate, each of the isolation layer patterns having a lower portion buried in the substrate and an upper portion protruding from the substrate;

forming an insulation structure on a portion of the substrate between the isolation layer patterns, the insulation structure comprising at least one oxide layer formed by at least one oxidation process and at least one nitride layer formed by at least one nitration process;

forming a floating gate on the insulation structure;

forming a dielectric layer on the floating gate; and forming a control gate on the dielectric layer, wherein forming the insulation structure includes, simultaneously performing a first oxidation process and a first nitration process to form a preliminary oxide layer on the substrate by partially oxidizing the substrate, and a preliminary nitride layer beneath the preliminary oxide layer by changing a lower portion of the preliminary oxide layer, and performing a second oxidation process to form a lower nitride layer from the preliminary nitride layer on the substrate, a lower oxide layer from the preliminary oxide layer on the lower nitride layer, and a first upper oxide layer from the preliminary oxide layer on the lower oxide layer.

3. The method of claim 1, further comprising:

performing a second nitration process to form a second upper oxide layer from the first upper oxide layer on the lower oxide layer, and an upper nitride layer on the second upper oxide layer by changing an upper portion of the first upper oxide layer.

4. The method of claim 2, further comprising:

performing a second nitration process to form a second upper oxide layer from the first upper oxide layer on the lower oxide layer, and an upper nitride layer on the second upper oxide layer by changing an upper portion of the first upper oxide layer.

* * * * *